(12) United States Patent
Wright

(10) Patent No.: US 9,484,471 B2
(45) Date of Patent: Nov. 1, 2016

(54) COMPOUND VARACTOR

(71) Applicant: TriQuint Semiconductor, Inc., Hillsboro, OR (US)

(72) Inventor: Peter V. Wright, Portland, OR (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 14/485,532

(22) Filed: Sep. 12, 2014

(65) Prior Publication Data

US 2016/0079444 A1    Mar. 17, 2016

(51) Int. Cl.
*H01L 29/93* (2006.01)
*H01L 29/66* (2006.01)
*H01L 29/861* (2006.01)
*H01L 27/08* (2006.01)

(52) U.S. Cl.
CPC ........... *H01L 29/93* (2013.01); *H01L 27/0808* (2013.01); *H01L 29/6609* (2013.01); *H01L 29/66121* (2013.01); *H01L 29/66128* (2013.01); *H01L 29/66174* (2013.01); *H01L 29/861* (2013.01)

(58) Field of Classification Search
CPC . H01L 29/93; H01L 29/661; H01L 29/6609; H01L 29/861; H01L 29/66128; H01L 29/66121
USPC ................................. 257/599, 602
See application file for complete search history.

(56) References Cited

U.S. PATENT DOCUMENTS

| | | | | |
|---|---|---|---|---|
| 3,506,888 A | * | 4/1970 | Siebertz | H01L 27/00 257/598 |
| 3,612,964 A | * | 10/1971 | Kawazu | H01L 29/93 257/312 |
| 4,156,249 A | * | 5/1979 | Koo | H01L 29/94 257/298 |
| 4,389,660 A | * | 6/1983 | Decker | H01L 29/8124 257/270 |
| 4,409,608 A | * | 10/1983 | Yoder | H01L 29/93 257/277 |
| 4,449,141 A | * | 5/1984 | Sato | H01L 29/93 257/596 |
| 4,616,197 A | * | 10/1986 | Wright | H03H 9/02685 310/313 D |
| 4,731,595 A | * | 3/1988 | Wright | H03H 9/02685 310/313 D |
| 4,902,925 A | * | 2/1990 | Wright | H03H 9/02842 310/313 B |
| 5,055,889 A | * | 10/1991 | Beall | H01L 29/93 257/277 |

(Continued)

OTHER PUBLICATIONS

Huang, Cong et al., "A GaAs Junction Varactor With a Continuously Tunable Range of 9 : 1 and an $OIP_3$ of 57 dBm," IEEE Electron Device Letters, vol. 31, No. 2, Feb. 2010, pp. 108-110.

(Continued)

*Primary Examiner* — Matthew Landau
*Assistant Examiner* — Grant Withers
(74) *Attorney, Agent, or Firm* — Withrow & Terranova, P.L.L.C.

(57) ABSTRACT

Embodiments include apparatuses and methods related to a compound varactor. A first varactor in the compound varactor may include a collector layer and a first base layer that is arranged in a first plurality of parallel fingers. A second varactor in the compound varactor may include a second base layer arranged in a second plurality of parallel fingers, and the base layer may be coupled with the collector layer. In embodiments, the fingers of the base layers of the first varactor and the second varactor may be interleaved with one another. Other embodiments may be disclosed or claimed herein.

15 Claims, 23 Drawing Sheets

(56) References Cited

U.S. PATENT DOCUMENTS

| | | | | |
|---|---|---|---|---|
| 5,073,763 A * | 12/1991 | Wright | ............... | H03H 9/14505 310/313 B |
| 5,220,194 A * | 6/1993 | Golio | ................. | H01L 29/7391 257/312 |
| 5,426,339 A * | 6/1995 | Wright | ................... | H03H 9/643 310/313 B |
| 6,037,650 A * | 3/2000 | Ioffe | ....................... | H01L 29/93 257/596 |
| 6,400,001 B1 * | 6/2002 | Manzini | ................. | H01L 29/94 257/313 |
| 6,787,882 B2 * | 9/2004 | Kirchoefer | ............. | H01L 29/93 257/480 |
| 6,794,707 B1 * | 9/2004 | Cao | .................... | H01L 27/0811 257/312 |
| 7,009,276 B2 * | 3/2006 | Kusabe | ................ | H01L 27/016 257/532 |
| 7,129,801 B2 * | 10/2006 | Wu | ........................ | H03L 7/099 331/117 FE |
| 7,151,036 B1 * | 12/2006 | Goldberger | ............. | H01G 4/33 438/210 |
| 7,323,763 B2 * | 1/2008 | Suzuki | ............... | H01L 27/0658 257/544 |
| 7,453,334 B1 * | 11/2008 | Abbott | ............... | H03H 9/02543 310/313 B |
| 7,576,471 B1 * | 8/2009 | Solal | ................. | H03H 9/02858 310/313 B |
| 7,596,849 B1 * | 10/2009 | Carpenter | ............ | H03H 9/0547 29/592.1 |
| 8,039,922 B2 * | 10/2011 | Ni | .......................... | H01G 5/011 257/532 |
| 8,350,633 B1 * | 1/2013 | Abdolvand | ............ | H03B 5/323 310/321 |
| 8,436,698 B2 * | 5/2013 | Rogers | ................... | H01G 5/145 257/312 |
| 8,669,605 B2 * | 3/2014 | Shimizu | .............. | H01L 27/0207 257/308 |
| 8,803,288 B1 * | 8/2014 | Marino | .................... | H01G 7/00 257/602 |
| 2004/0065939 A1 * | 4/2004 | Maget | ..................... | H01L 29/94 257/516 |
| 2004/0100752 A1 * | 5/2004 | Hiraoka | .............. | H01L 27/0805 361/277 |
| 2004/0155719 A1 * | 8/2004 | Suzuki | .................. | H01L 29/732 331/177 V |
| 2004/0195643 A1 * | 10/2004 | Benaissa | ................ | H01L 29/94 257/480 |
| 2005/0067674 A1 * | 3/2005 | Maget | ..................... | H01L 29/94 257/595 |
| 2005/0156194 A1 * | 7/2005 | Ohbu | .............. | H01L 27/0605 257/197 |
| 2006/0033163 A1 * | 2/2006 | Chen | .................. | H01L 27/0277 257/355 |
| 2006/0125012 A1 * | 6/2006 | Fathimulla | ............... | G01K 7/01 257/351 |
| 2006/0125052 A1 * | 6/2006 | Moon | ................. | H01L 27/0808 257/595 |
| 2006/0228064 A1 * | 10/2006 | Hunt | ..................... | G02F 1/0316 385/2 |
| 2006/0267105 A1 * | 11/2006 | Maeda | ............. | H01L 21/26586 257/379 |
| 2007/0132065 A1 * | 6/2007 | Lee | ...................... | H01G 4/1227 257/595 |
| 2007/0181934 A1 * | 8/2007 | Hu | .................... | H01L 23/49541 257/315 |
| 2007/0228505 A1 * | 10/2007 | Mazzola | ............. | H01L 29/8611 257/471 |
| 2008/0099881 A1 * | 5/2008 | Jung | ................... | H01L 27/0676 257/601 |
| 2008/0157159 A1 * | 7/2008 | Hook | .................... | H01L 29/945 257/312 |
| 2008/0191260 A1 | 8/2008 | De Vreede et al. | | |
| 2009/0090951 A1 * | 4/2009 | Chang | ................. | H01L 23/5223 257/306 |
| 2009/0134960 A1 | 5/2009 | Larson et al. | | |
| 2009/0195958 A1 | 8/2009 | Vavelidis et al. | | |
| 2009/0289329 A1 * | 11/2009 | Pawlikiewicz | ... | H01L 29/66174 257/596 |
| 2010/0032794 A1 * | 2/2010 | Pendharkar | ........... | H01L 21/761 257/509 |
| 2010/0207207 A1 * | 8/2010 | Tsai | .................... | H01L 29/0692 257/343 |
| 2010/0213517 A1 * | 8/2010 | Sonsky | ................ | H01L 29/402 257/288 |
| 2010/0259329 A1 * | 10/2010 | Tserng | .................... | H01L 23/66 330/277 |
| 2010/0259864 A1 * | 10/2010 | Kanno | .................... | H01L 28/60 361/277 |
| 2010/0264426 A1 * | 10/2010 | Blair | ....................... | C23C 16/27 257/77 |
| 2011/0006307 A1 * | 1/2011 | Chen | ................... | H01L 29/0692 257/76 |
| 2011/0068655 A1 * | 3/2011 | Solal | .................. | H03H 9/02858 310/313 B |
| 2011/0140240 A1 | 6/2011 | Trivedi | | |
| 2011/0233678 A1 * | 9/2011 | Tsai | ................... | H01L 27/0255 257/357 |
| 2012/0154956 A1 * | 6/2012 | Vashchenko | ........ | H01L 27/0255 361/1 |
| 2012/0161577 A1 * | 6/2012 | Abbott | ............... | H03H 9/02858 310/313 C |
| 2012/0281336 A1 * | 11/2012 | Marino | ..................... | H01G 7/00 361/281 |
| 2013/0062625 A1 * | 3/2013 | Takada | .............. | H01L 29/41758 257/77 |
| 2013/0228894 A1 * | 9/2013 | Yen | ..................... | H01L 23/5223 257/532 |
| 2013/0342953 A1 * | 12/2013 | Subramanyam | ........ | H01L 28/55 361/277 |
| 2014/0035032 A1 * | 2/2014 | Korec | ................. | H01L 21/8234 257/337 |
| 2014/0225225 A1 * | 8/2014 | Chung | ................ | H01L 28/40 257/532 |
| 2014/0273323 A1 | 9/2014 | Kim | | |
| 2015/0054037 A1 * | 2/2015 | Hao | ....................... | H01L 29/205 257/200 |
| 2015/0084107 A1 * | 3/2015 | Li | ........................ | H01L 23/5223 257/300 |
| 2015/0194538 A1 * | 7/2015 | Marino | ................... | H01L 29/94 327/530 |
| 2015/0325573 A1 | 11/2015 | Wright et al. | | |

OTHER PUBLICATIONS

Restriction Requirement for U.S. Appl. No. 14/273,316, mailed Feb. 2, 2015, 8 pages.
Non-Final Office Action for U.S. Appl. No. 14/273,316, mailed Apr. 20, 2015, 14 pages.
Author Unknown, "The Nuts and Bolts of Tuning Varactors," Digi-Key Corporation, Sep. 3, 2009, 15 pages.
Poole, Ian, "Varactor Abrupt & Hyperabrupt Diodes," Radio Electronics.com, Date Accessed: Feb. 9, 2016, 5 pages, http://www.radio-electronics.com/info/data/semicond/varactor-varicap-diodes/hyperabrupt.php.
Final Office Action for U.S. Appl. No. 14/279,316, mailed Nov. 27, 2015, 18 pages.
Kumar, Tribhuwan, "Varactor theory," SlideShare.net, Published on Dec. 21, 2013, slide 14, http://www.slideshare.net/tribhuwankumar73/varactor-theory, 1 page.
Non-Final Office Action for U.S. Appl. No. 15/005,235, mailed Jul. 29, 2016, 13 pages.
Non-Final Office Action for U.S. Appl. No. 14/273,316, mailed Sep. 2, 2016, 14 pages.

* cited by examiner

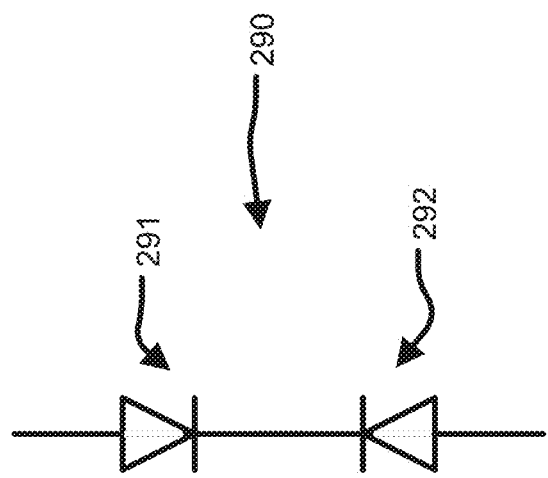

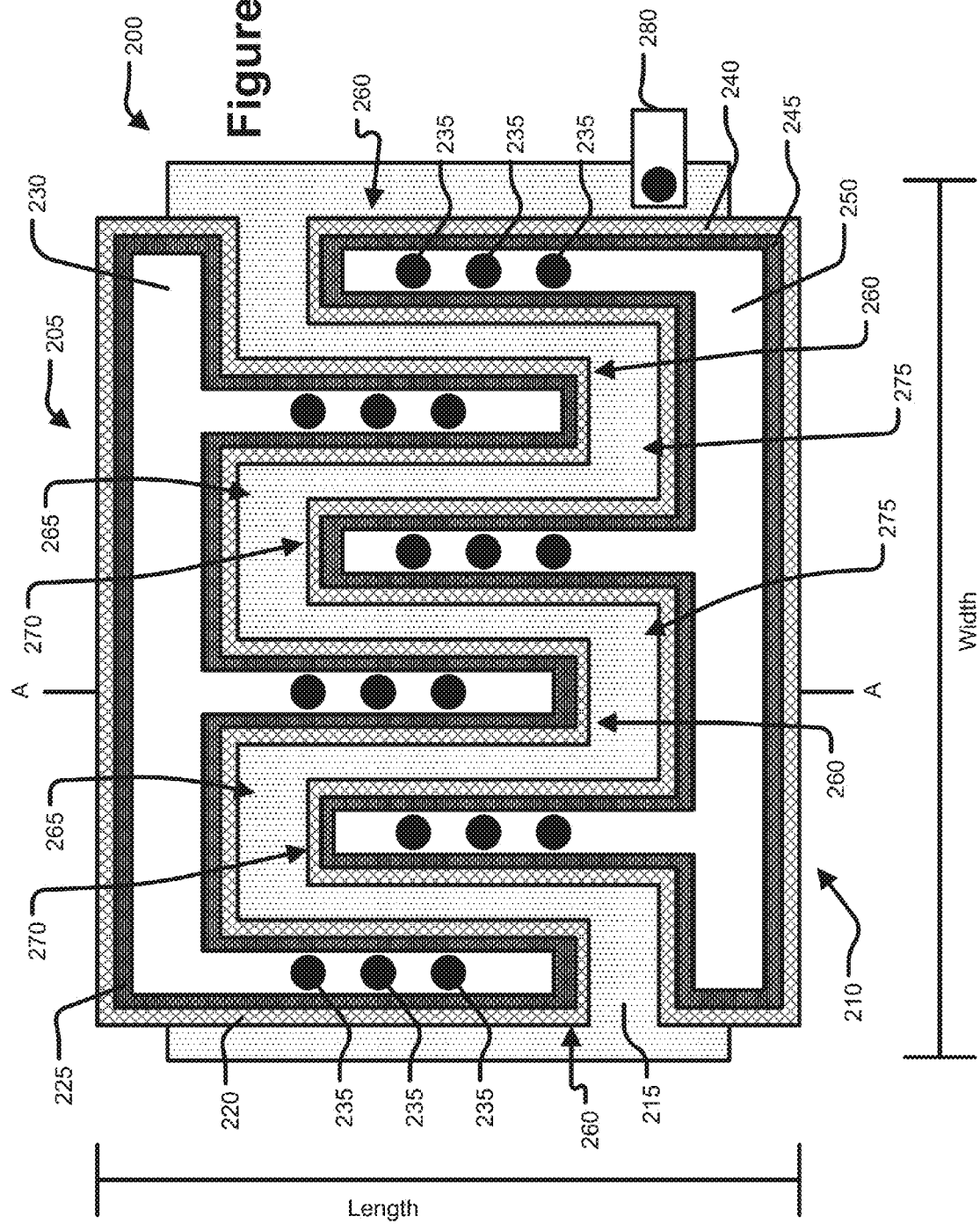

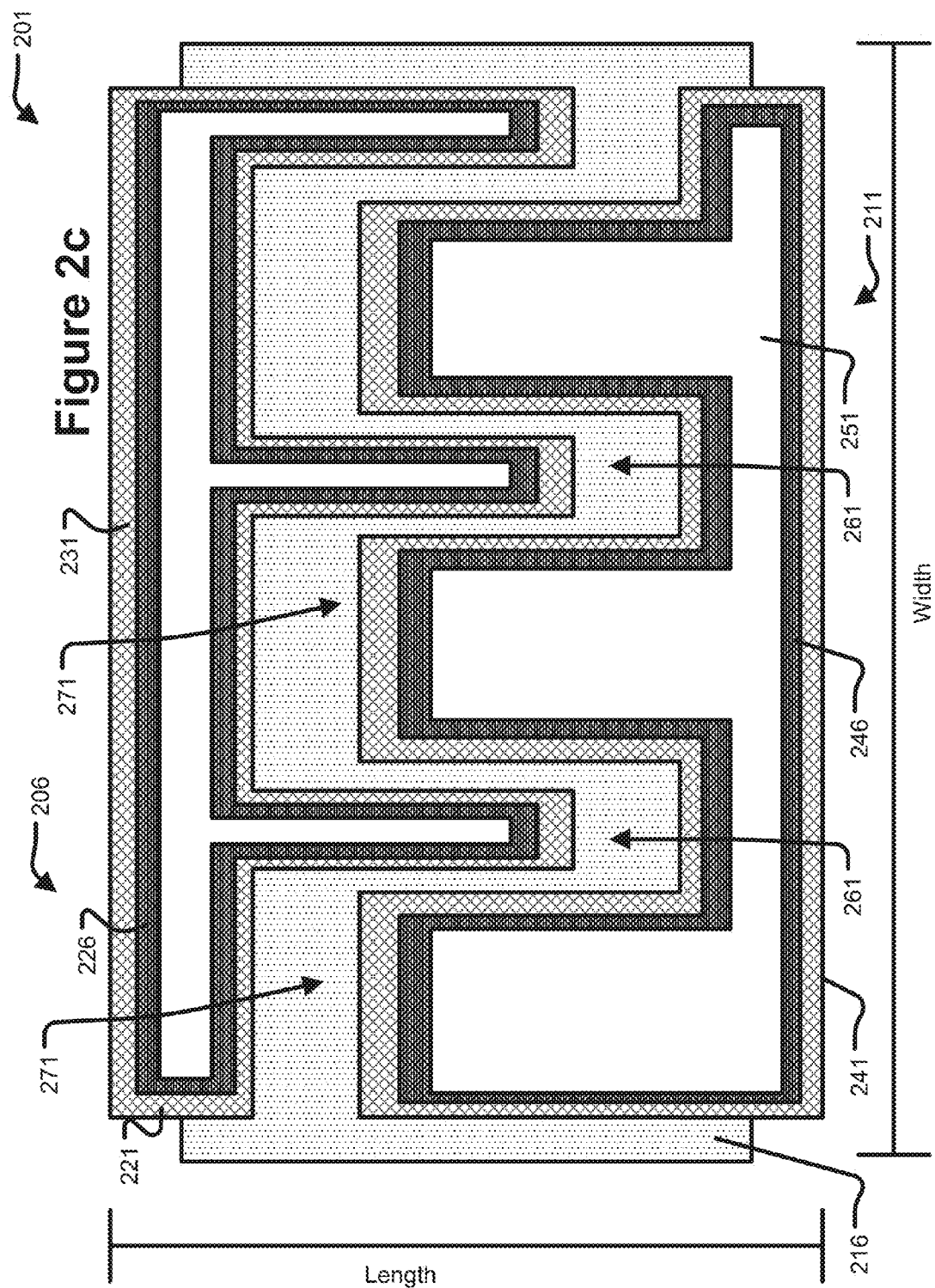

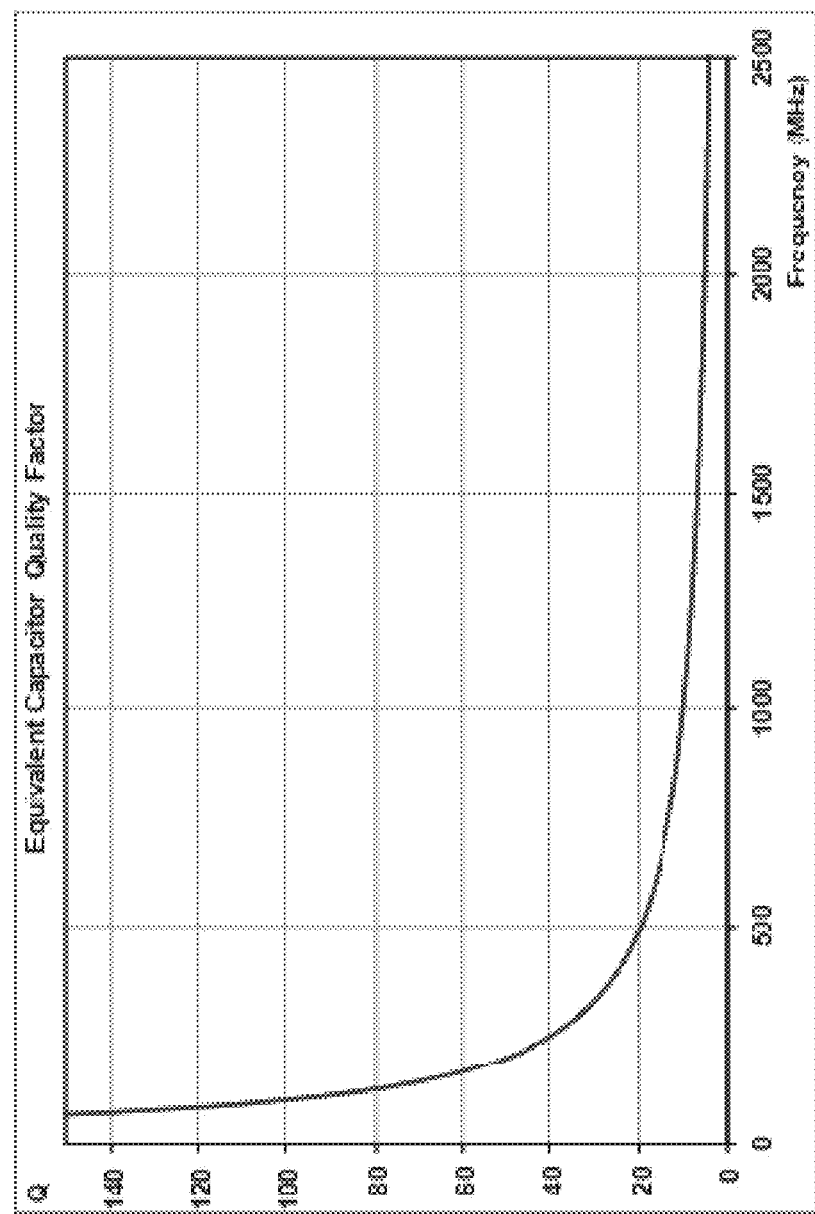
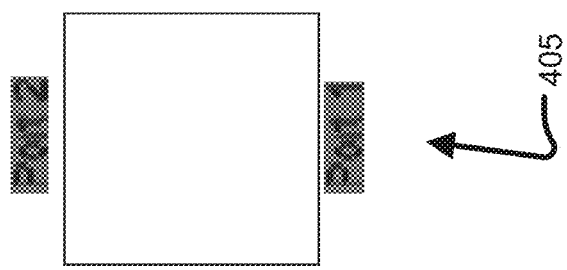
Figure 4b

COMPOUND VARACTOR

FIELD

Embodiments of the present disclosure relate generally to the field of circuits, and more particularly to reverse-biased diodes (varactors).

BACKGROUND

A diode under reverse bias may exhibit a capacitance that varies inversely with the applied voltage. A component that behaves in this manner, e.g., as a variable capacitor, may be termed a varactor. The variable capacitance of the diode may be used for "tuning" electrical circuits. Generally, semiconductor varactors may have a wider tuning range (e.g., capacitance variance) and lower control voltage requirements than dielectric varactors realized on materials such as barium strontium titanate (BST). However, the semiconductor varactors may typically exhibit a lower capacitance per unit area than a dielectric varactor, thereby requiring a larger die area to implement a given capacitance.

Generally, a varactor may be considered a two-port device, e.g., having a single input terminal and a single output terminal. As such, varactors may be prone to self-modulation distortion resulting from applied radio frequency (RF) voltages. This self-modulation distortion may introduce nonlinearity into a circuit using the varactors. To reduce this nonlinearity to acceptable levels, a number of individual varactors may be coupled in series to divide the RF voltage across them. If the number of varactors in the series is n, then the die area on the circuit board required to realize a desired net capacitance may be increased by a factor of $n^2$ if the varactors are co-planar to one another. If a relatively large number of varactors are used, then this circuit may make the required die area prohibitively large for use in modern devices.

In some cases such as oscillator or voltage-controlled oscillator (VCO) circuits in a mobile device, a high quality factor of greater than approximately 50 for the varactor may be desirable for increasing efficiency or reducing battery drain of the mobile device. Generally, the quality factor may be considered to be a measurement of the reactance of the varactor (e.g., the impedance presented to an RF signal propagating through the varactor) compared to the resistance of the varactor. However, if the collector or sub-collector of the varactor has a relatively high resistivity, such a quality factor may be difficult to achieve.

BRIEF DESCRIPTION OF THE DRAWINGS

Embodiments are illustrated by way of example and not by way of limitation in the figures of the accompanying drawings, in which like references indicate similar elements and in which:

FIG. 2a illustrates an example circuit diagram of a series-connected pair of reverse-connected varactors, in accordance with various embodiments.

FIG. 2b illustrates an example overhead view of a series-connected pair of equal reverse-connected varactors that may be used in the circuit of FIG. 2a, in accordance with various embodiments.

FIG. 2c illustrates an example overhead view of a non-equal series-connected pair of equal reverse-connected varactors that may be used in the circuit of FIG. 2a, in accordance with various embodiments.

FIG. 4b illustrates a varactor with a square footprint and associated quality factor versus frequency dependence, in accordance with various embodiments.

DETAILED DESCRIPTION

Figure 1A:
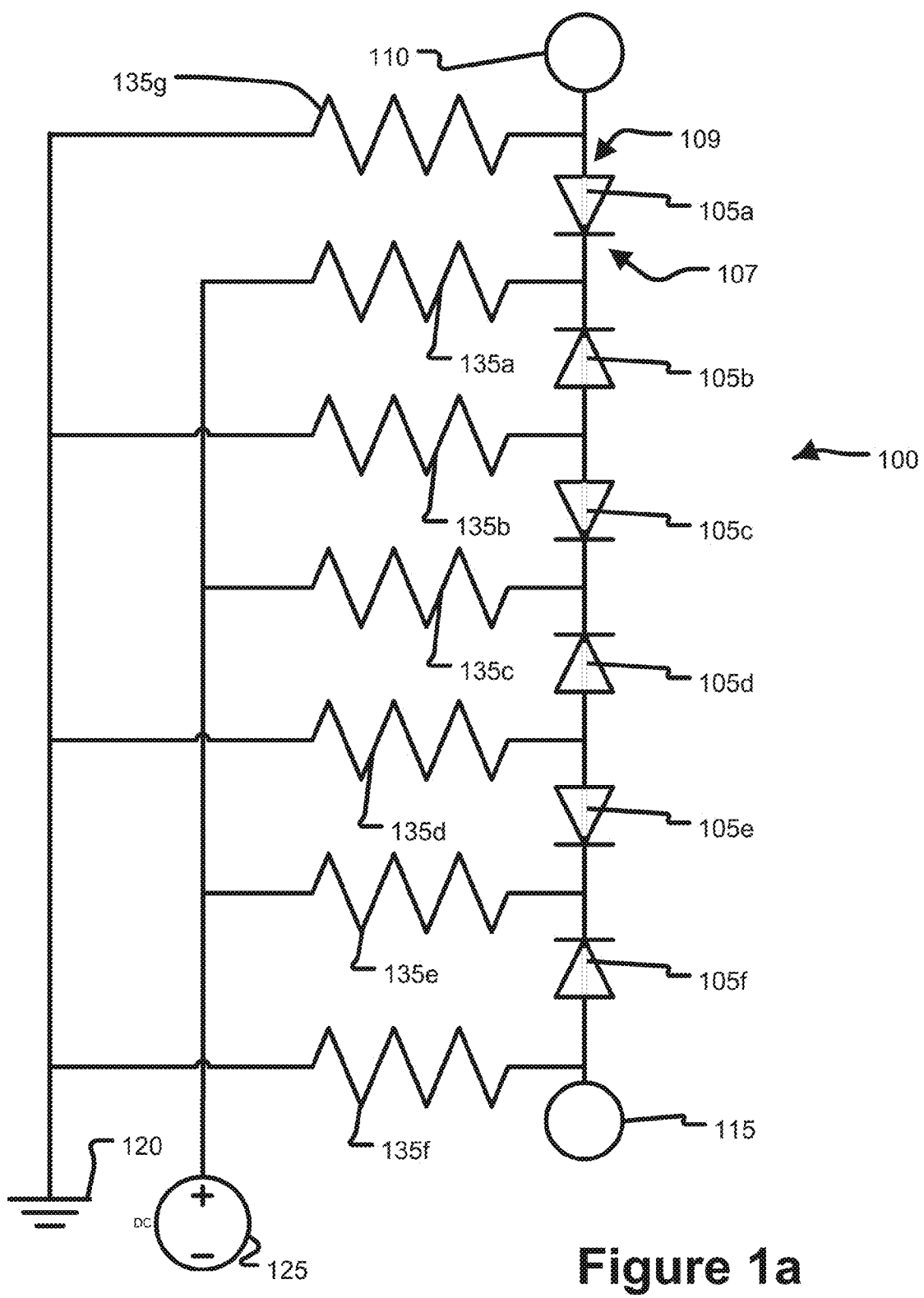
FIG. 1a illustrates an example compound varactor circuit, with a parallel resistive bias network, in accordance with various embodiments.

Embodiments include apparatuses and methods related to a compound varactor. Generally, a compound varactor may refer to a compact configuration of two varactors. A first varactor in the compound varactor may include a collector layer and a first base layer that is arranged in a first plurality of parallel fingers. A second varactor in the compound varactor may include a second base layer arranged in a second plurality of parallel fingers, and the base layer may be coupled with the collector layer. In embodiments, the fingers of the base layers of the first varactor and the second varactor may be interleaved with one another.

In some embodiments, the fingers of the first varactor may have a first width, and the fingers of the second varactor may have a second width that may be the same as or different than the first width. In some embodiments, a plurality of compound varactors may be coupled with one another in series or parallel.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Various figures may depict various vertical stacks of layers which may be epitaxially deposited. The sizes, widths, or heights of the various layers are not drawn to scale, and should not be assumed to be limited to being identical to, or different from, one another unless explicitly indicated to be so in the description below.

As noted above, in certain applications a varactor or varactors with a high quality factor may be desirable to maximize signal quality while minimizing battery drain. It has been observed in legacy varactors that by increasing the width of a varactor while reducing the length, the signal quality may be increased. However, there may be limits to the amount in which the width or length of the varactor may be altered based on the amount of space available in a given system or on a given circuit board. Also, the propagation of a radio frequency (RF) signal through the varactor may cause the varactor to self-modulate, which may be undesirable.

FIG. 1a illustrates an example compound varactor circuit 100 with a parallel resistive bias network, in accordance with various embodiments. The circuit 100 may include a plurality of varactors such as varactors 105a, 105b, 105c, 105d, 105e, or 105f (collectively varactors 105) generally positioned between an input terminal 110 and an output terminal 115. In embodiments, each of varactors 105 may be identical to one another, while in other embodiments one or more of the varactors 105 may be different from another of the varactors 105. Examples of differences between varactors 105 are discussed in greater detail below with respect to FIG. 1b and elsewhere. In some embodiments, the input terminal 110 may be configured to receive a radio frequency (RF) signal that may then propagate through the circuit 100 to the output terminal 115 (or vice versa). In some embodiments, one or more of the varactors 105 may be connected in parallel with the input terminal 110 and the output terminal 115, in which case the RF signal may not propagate through the varactor to the output terminal 115. In some cases, the circuit 100 may be used in shunt across an RF line in which case the output terminal 115 may be coupled with ground.

In some embodiments, each of the varactors 105 may have a "front" side and a "back" side. FIG. 1a depicts the front side 107 and back side 109 of varactor 105a. In embodiments the front side 107 of varactor 105a may be referred to as the "cathode" of varactor 105a, and the back side 109 of varactor 105a may be referred to as the "anode" of varactor 105a. In FIG. 1, each of the varactors 105 may have a front side and a back side (or cathode and anode), though specific designators in FIG. 1 are omitted for each varactor for the sake of clarity.

In some embodiments, two or more of the varactors 105 may be coupled with one another in a back-to-back configuration. Specifically, the anodes of the varactors may be coupled directly to one another. For example, varactors 105b and 105c may be considered to be in a back-to-back configuration as shown in FIG. 1a. In other embodiments, the varactors 105 may be coupled with one another in a front-to-front configuration as shown in FIG. 1a. Specifically, the cathodes of the varactors may be coupled directly to one another. For example, varactors 105a and 105b may be considered to be in a front-to-front configuration as shown in FIG. 1.

In embodiments, the back sides of one or more of the varactors 105 may be coupled with ground 120. Additionally, the front sides of one or more of the varactors 105 may be coupled with a DC power source 125. The DC power source 125 may be configured to provide a positive control voltage ($V_{CTRL}$) to reverse bias the varactors 105. In some embodiments, $V_{CTRL}$ may be between approximately 2 Volts (V) and approximately 18 V, while in other embodiments $V_{CTRL}$ may be between approximately −1.2 V and approximately 3 V. In other embodiments (not shown), the front sides of the varactors 105 may be coupled with ground 120, and the back sides of the varactors 105 may be coupled with a DC power source 125. In those embodiments, the DC power source 125 may be configured to provide a negative $V_{CTRL}$ to reverse bias the varactors 105. Other more complicated circuits may be envisioned having multiple DC power sources that may each supply different or similar positive or negative voltages, or multiple ground connections.

In embodiments one or more resistors such as resistors 135a, 135b, 135c, 135d, 135e, 135g, and 135f (collectively resistors 135) may be positioned between the varactors 105 and the ground 120 or the DC power source 125. In some embodiments, the resistance of each of the resistors 135 may be equal while in other embodiments certain of the resistors 135 such as outer resistors 135f or 135g may be greater than others of the resistors 135. For example, in embodiments, the resistance of resistors 135f and/or 135g may be approximately 60 kilo-ohms (kO), while in other embodiments the resistance of resistors 135f and/or 135g may be between approximately 20 kO and approximately 60 kn. Similarly, in some embodiments the resistance of resistors 135a, 135b, 135c, 135d, or 135e may be approximately 30 kO, while in other embodiments the resistance of resistors 135a, 135b, 135c, 135d, or 135e may be between approximately 10 kO and approximately 30 kn.

As shown above, the circuit 100 may include a number of varactors 105 and resistors 135. Although only six varactors 105 and five resistors 135 are shown in FIG. 1, in other embodiments the circuit 100 may include a greater or lesser number of varactors 105 or resistors 135. In some embodiments, it may be desirable for the circuit to include at least the resistors 135a and 135e. In some embodiments, inductors may also be used in place of, or in combination with, the resistors 135. As discussed above, as the number of varactors 105 in the compound varactor 100 increases, the area that the compound varactor 100 requires on a die may increase exponentially if all of the varactors 105 are co-planar to one another.

Figure 1B:
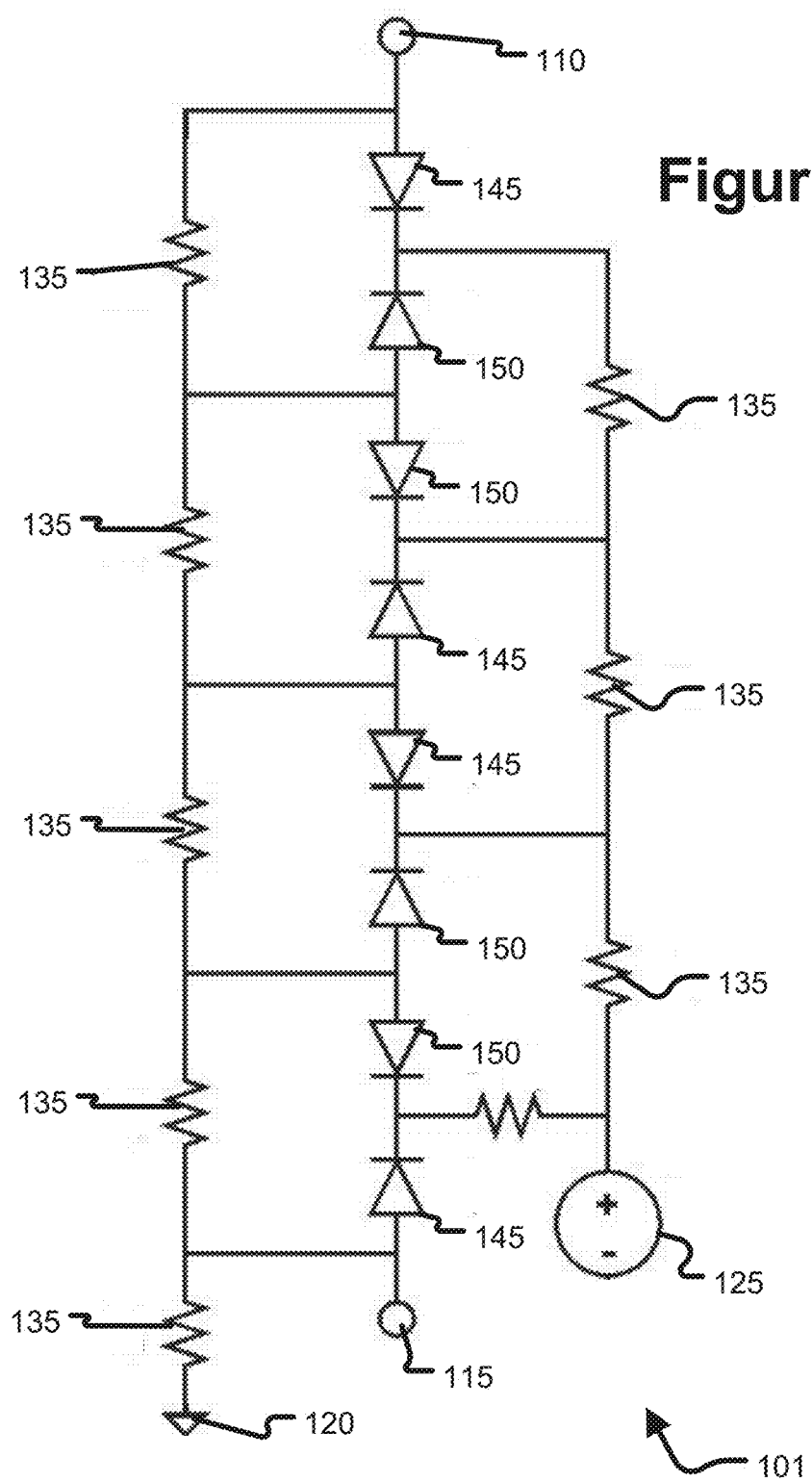
FIG. 1b illustrates another example of a compound varactor circuit with a resistive bias network, in accordance with various embodiments.

FIG. 1b illustrates an example of a compound varactor circuit with an alternative resistive bias network. Specifically, the circuit 101 may include a series tree-type bias network in place of the parallel resistive bias network of FIG. 1a. In embodiments, circuit 101 may include the input terminal 110, DC power source 125, ground 120, and terminal 115, and resistors 135 as described above with respect to FIG. 1a. Circuit 101 may further include varactors 145 and 150, which may be similar to varactors 105 of FIG. 1a. In embodiments, each of varactors 145 and 150 may be similar to one another, while in other embodiments the varactors 145 may be similar to one another, but different from varactors 150, as described below.

Figure 1C:
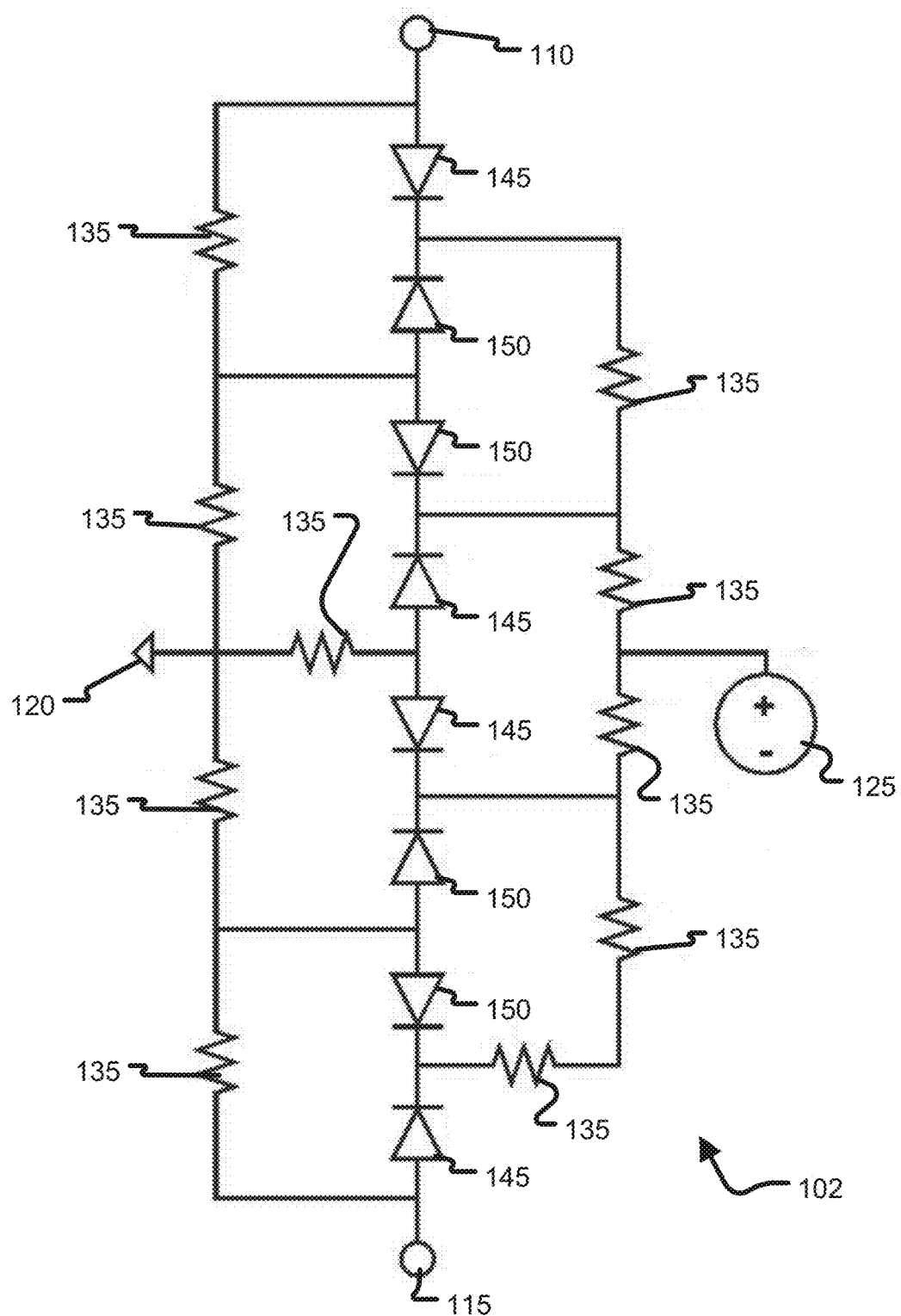
FIG. 1c illustrates another example of a compound varactor circuit with a resistive bias network, in accordance with various embodiments.

Generally, circuits 100 and 101 may be more desirably used in shunt across the RF line, with output terminal 115 coupled with ground. FIG. 1c illustrates an example of a compound varactor circuit 102 with an alternative resistive bias network. Specifically, circuit 102 may include a series tree-type resistive bias network with a symmetric bias feed that may be more suitable for a varactor to be used in series with the RF line. Specifically, circuit 102 may include the input terminal 110, DC power source 125, ground 120, and terminal 115, and resistors 135 as described above with respect to FIG. 1b. Circuit 102 may further include varactors 145 and 150, which may be similar to varactors 145 and 150 of FIG. 1b. In embodiments, each of varactors 145 and 150 may be similar to one another, while in other embodiments the varactors 145 may be similar to one another, but different from varactors 150, as described below.

Generally, any of circuits 100, 101, and 102 may be used if DC power source 125 is coupled to the back sides of varactors 105, 145, and 150 and configured to provide a negative bias control voltage, as described above.

Typically, in a varactor such as one of varactors 105, 145, or 150, the top region of the varactor (e.g., base or anode) may be coupled with a metalized layer of Aluminum (Al), Copper (Cu), Gold (Au), or some other metal or alloy with a relatively low resistivity. This metalized layer of the varactor may be used as an electrode that has a very low resistance, which results in very low loss of RF energy flowing through the varactor.

In contrast, the bottom region of the varactor (e.g., collector or cathode) may be coupled with a sub-collector doped region. Typically, the resistivity of the collector and/or sub-collector may have a resistivity that is significantly higher than that of the metalized layer. For example, in some embodiments the resistivity of the collector and/or sub-collector may be an order of magnitude greater than the resistivity of the metalized layer.

The quality factor Q of a varactor may be defined in terms of the angular frequency $\omega$ ($2\pi*f$, where f may be the frequency of the RF signal passing through the varactor), C (the varactor capacitance), and R (a resistive component). Specifically, the quality factor Q may be $$Q \propto \frac{1}{\omega CR}.$$

Generally, R may be an equivalent series resistance value that may account for dissipative losses in the varactor. In high Q varactors, this resistive component may arise primarily based on resistance in the bottom electrode of the varactor, e.g., the collector/sub-collector.

Figure 4A:
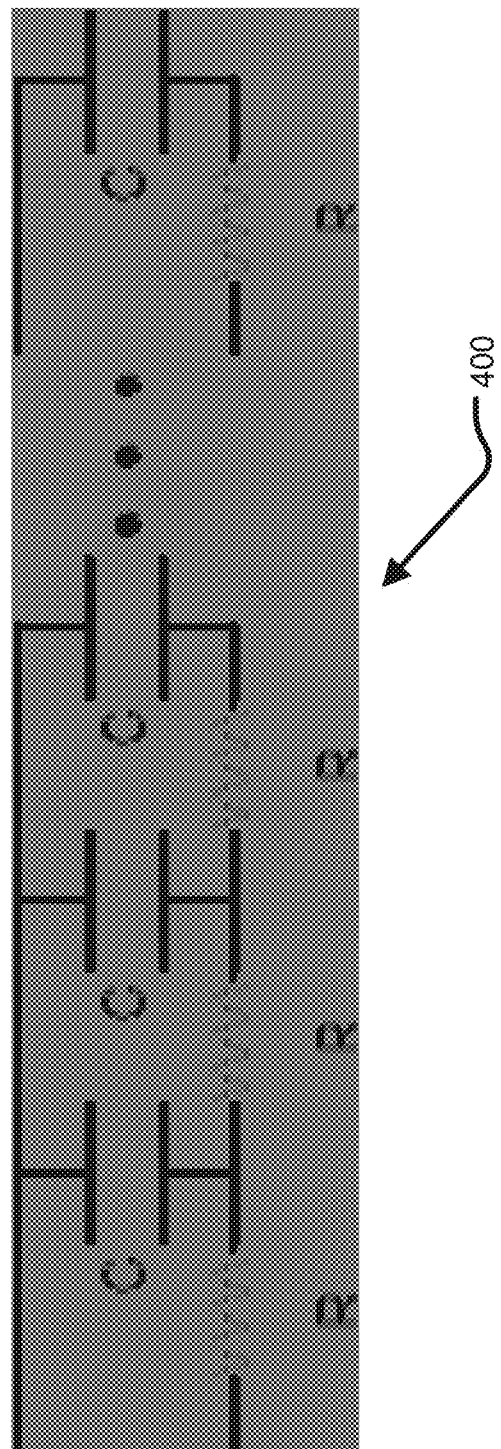
FIG. 4a illustrates an equivalent-circuit model that may be used to study varactor Q dependence on sub-collector resistivity, in accordance with various embodiments.

To model the losses associated with the high resistivity of the collector/sub-collector region, an equivalent circuit model 400 such as that illustrated in FIG. 4a may be used. Specifically, the model 400 may include a plurality of capacitors C and resistors R. Using the model 400, FIG. 4b shows the predicted quality factor dependence over frequency of a varactor 405 with a square footprint.

Figure 4C:
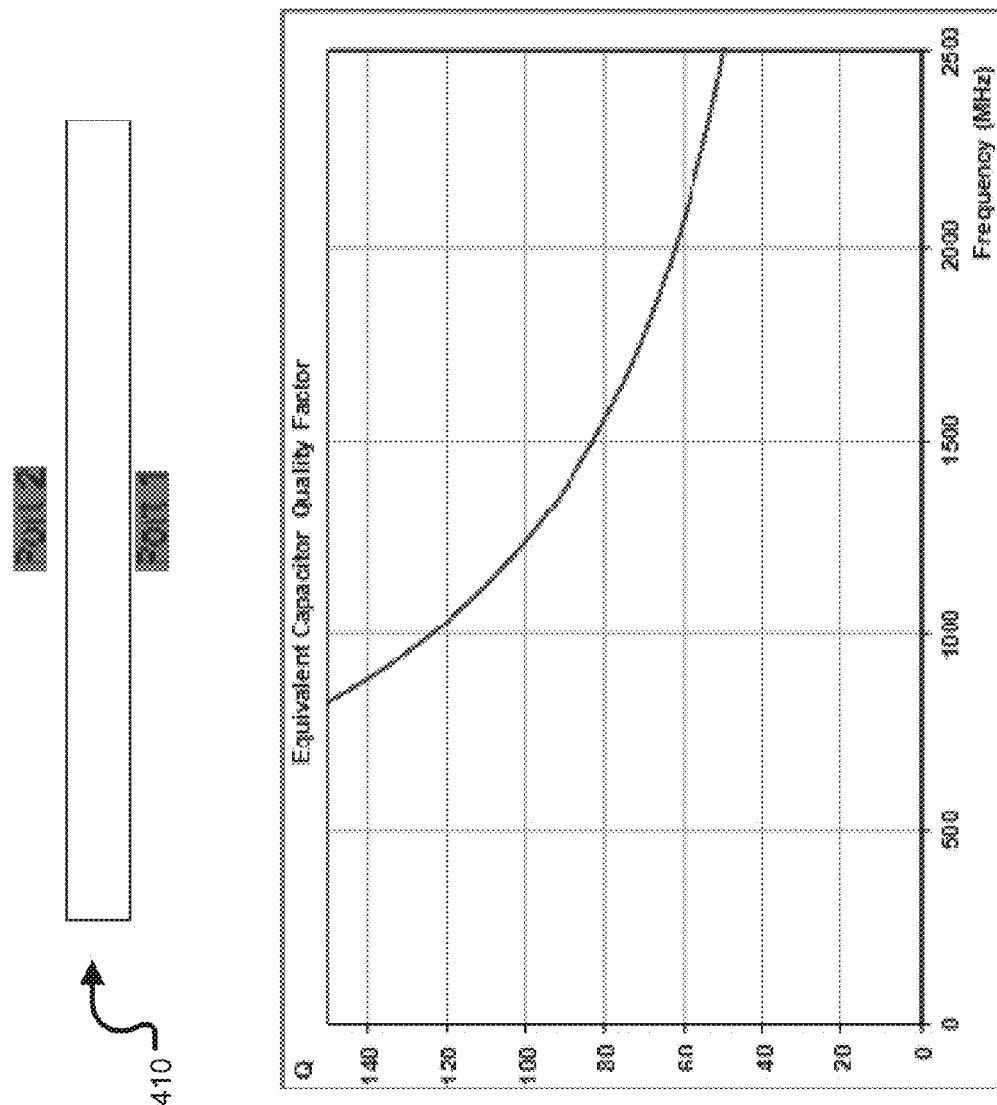
FIG. 4c illustrates a varactor with a wide aspect ratio footprint and associated quality factor versus frequency dependence, in accordance with various embodiments.

The model prediction for the quality factor dependence over frequency of a varactor 410 with an equivalent footprint, but having a wide aspect ratio, is shown for comparison in FIG. 4c. It can be seen that a varactor layout with a wider form factor may have a substantially improved quality factor Q. This improved quality factor Q may be due to the shorter propagation distance in the collector/sub-collector between ports 1 and 2. In general, if the varactor area and capacitance is kept constant, the quality factor Q of the varactor may have the following dependence on the width of the varactor: $Q \propto W^2$. Therefore, making the varactor as wide as possible in a direction normal to the input and output ports may maximize the quality factor Q of the varactor. However, in practice there may be limits on how wide the varactor can be made.

FIG. 2a illustrates an example circuit for a compound varactor 290 that includes a pair of reverse-biased varactors having a series connection with an increased quality factor Q. Specifically, the compound varactor 290 may include a first varactor 291 and a second varactor 292 in a front-to-front configuration. Additionally, in some embodiments circuit 200 may include one or more resistors such as resistors 135, a ground connection such as ground 120, a DC power source such as power source 125, an input terminal such as input terminal 110, and/or an output terminal such as output terminal 115 as shown in FIG. 1a.

FIG. 2b illustrates an overhead view of a compound varactor 200 that may correspond to the compound varactor 290 and exhibit an increased quality factor Q, in accordance with various embodiments. As will be recognized, the compound varactor 200 may include a pair of front-to-front varactors that both include a plurality of electrode fingers. As noted above, the collector/sub-collector of the compound varactor 200 may have a relatively high resistance compared to the resistance of the electrode fingers. By implementing two front-to-front varactors with a plurality of electrode fingers, the distance that the signal is required to travel through the collector/sub-collector layer may be reduced or minimized, which may result in a significant reduction in resistance experienced by an RF signal traveling through the compound varactor 200. This reduction in resistance may result in an increase in the quality factor Q.

An additional advantage of the compound varactor 200 may be that in certain legacy embodiments only a single varactor may be implemented such that electrode fingers are used for a first port of the varactor, and the second port of the varactor may be coupled directly with the collector/sub-collector layer through one or more vias. This legacy design may exhibit a significantly decreased capacitance per unit area, and an increased quality factor Q, because the second port that is coupled directly with the collector/sub-collector layer may not result in a measurable capacitance because the corresponding base layer in that region may be missing. In other words, the space where the second port is coupled directly with the collector/sub-collector layer may not have a significant electrical effect on the RF signal traveling through the varactor. By contrast, in embodiments herein, the base layer may be continuous under all of the electrode fingers. As such, the compound varactor 200 may experience only a minimal reduction in the capacitance per unit area based on the fingers of the electrodes, resulting in a significant advantage in terms of both size and cost of the invention. This reduction in capacitance per unit area may be a result of the small but necessary gaps between the electrodes.

In embodiments, the compound varactor 200 may include two separate varactors 205 and 210 (that may respectively correspond to varactors 291 and 292), and have a Length and a Width as designated in FIG. 2b. In embodiments, varactors 205 and 210 may be similar to one of varactors 105. Specifically, the first varactor 205 may include a collector layer 215. The collector layer 215 may be composed of or include a semiconductor material such as gallium arsenide, silicon, germanium, aluminum phosphide, aluminum arsenide, indium phosphide, gallium nitride, combinations or alloys thereof, or some other semiconductor. In some embodiments, the collector layer 215 may be doped or heavily doped with one or more impurities such as carbon, zinc, beryllium, or some other dopant. In embodiments, the collector layer 215 may be doped with an "n+" dopant.

The varactor 205 may include a base layer 220 directly coupled with the collector layer 215. The base layer 220 may be composed of or include one or more of the semiconductor materials discussed above, but the base layer 220 may be doped with a "p+" dopant. The varactor 205 may further include a first metal layer 225 directly coupled with the base layer 220. The first metal layer 225 may be composed of or include titanium, platinum, gold, zinc, nickel, beryllium, or combinations or alloys thereof. The varactor 205 may further include a second metal layer 230 directly coupled with the first metal layer 225. The second metal layer 230 may be composed of or include one or more of the same materials listed above as the first metal layer 225. In some embodiments, the first metal layer 225 and second metal layer 230 may be composed of identical materials, while in other embodiments the first metal layer 225 and second metal layer 230 may be composed of different materials. In some embodiments, vias 235 may communicatively connect two or more of the base layer 220 or the metal layers 225 and 230. In some embodiments, one or both of the metal layers 225 or 230 may not be included in compound varactor 200.

The second varactor 210 may be similar to the first varactor 205, and include the collector layer 215, a base layer 240, a first metal layer 245, and a second metal layer 250, which may be similar to base layer 220, first metal layer 225, and second metal layer 230, respectively. In embodiments, vias 235 may electrically couple one or more of base layer 240, metal layer 245, and metal layer 250, as described above. In some embodiments, the collector layer 215 may include a sub-collector layer (not shown) that is directly coupled with the collector layer 215 on a side of the collector layer 215 directly opposite the base layers 220 and 240. It will be understood that although each of the layers is depicted in FIG. 2 as smaller than or inside of one or more other layers, such depiction is done for the ease of understanding the relative positioning of the layers, and in some embodiments different layers such as the base layer 220 and metal layer 225 may have approximately similar or identical lengths or widths. In some embodiments, the collector layer 215 may be coupled with a bias input 280 that may be coupled with and configured to receive a voltage bias from, for example, DC power source 125.

In some embodiments, one or more of the base layer 220 or metal layers 225 or 230 of the first varactor 205 may be constructed as a plurality of generally parallel fingers 260 that define one or more lateral cavities or spaces 265. Similarly, one or more of the base layer 240 or metal layers 245 or 250 of the second varactor 210 may be constructed as generally parallel fingers 270 that define a plurality of spaces 275. Fingers 260 and 270 may be the "electrode fingers" discussed above. As shown, fingers 270 may be positioned in spaces 265, and fingers 260 may be positioned in spaces 275 such that the fingers 260 and 270 are considered to be interspersed or interleaved with one another.

In embodiments, the collector layer 215 may act as the cathode of varactors 205 and 210, while the base layers 220 and 240 may act as the anodes of varactors 205 and 210, respectively. That is, varactor 205 may be communicatively coupled with an input terminal such as input terminal 110 that is configured to provide an RF signal. The RF signal may propagate through the layers of varactor 205 to the collector layer 215. The RF signal may then propagate through the collector layer 215 and back up through the various layers of varactor 210, which in turn is communicatively coupled with an RF output terminal such as output terminal 115.

In the example compound varactor 200, the signal may propagate along the length of the compound varactor 200. Specifically, as compound varactor 200 is depicted in FIG. 2b, the RF signal may propagate from the top to the bottom of FIG. 2b or vice-versa. As noted above, the collector layer 215 may have a relatively high resistance, for example, on the order of 6 Ohms per square. By contrast, the resistance of the base layers or metal layers of varactors 205 or 210 may be very low. Therefore, it may be more desirable for a signal to propagate primarily through the base layers 220 and 240 or metal layers 225, 230, 245, and 250 of varactors 205 or 210 such that the distance that the signal has to propagate through collector layer 215 is minimized. By constructing varactors 205 and 210 to include a plurality of fingers 260 and 270, the signal may only travel through the collector layer 215 a short distance to one of fingers 270, or from one of fingers 260.

In some embodiments, improved performance may be realized by using a combination of different valued varactors in a compound varactor or plurality of compound varactors in series and/or parallel with one another. FIG. 2c illustrates an example overhead view of a non-equal series-connected pair of equal reverse-connected varactors in a compound varactor 201. The compound varactor 201 may have a relatively high Q compared to, for example, compound varactor 200.

The compound varactor 201 may include first and second varactors 206 and 211, which may be similar to first and second varactors 205 and 210. Specifically, varactor 206 may include a collector layer 216, a base layer 221, a first metal layer 226, and a second metal layer 231, which may be respectively similar to collector layer 215, base layer 220, metal layer 225, and metal layer 230, respectively. Varactor 211 may include the collector layer 216, base layer 241, metal layer 246, and metal layer 251, which may be respectively similar to base layer 240, metal layer 245, and metal layer 250. In embodiments, varactors 206 and 211 may include vias similar to vias 235, and a bias input that may be similar to bias input 280, both of which are not shown in FIG. 2c for the sake of clarity. In embodiments, varactor 206 may include fingers 261, and varactor 211 may include fingers 271. However, as can be seen in FIG. 2c, in embodiments fingers 261 may be significantly narrower than fingers 271. It will be understood that in other embodiments fingers 271 may be significantly narrower than fingers 261.

In compound varactor 201, the difference in widths of fingers 261 and 271 may result in an unequal capacitance between varactors 206 and 211. It should be noted that the number, width, and length of the fingers 261 and 271 may not be uniquely constrained, but may be flexible parameters that may be optimized to best achieve desired performance parameters. In FIG. 2c, for example, each of the arrays is depicted as having three fingers. However, the capacitance of each of the varactors 206 and 211 may be solely dependent upon the total area of the array of fingers. Thus, the two series-connected capacitances may be equally-well achieved with five fingers, seven fingers, or some other number of fingers in each of the arrays in other embodiments. In the case where there are more fingers in a given varactor, the fingers may be narrower than shown in either compound varactors 200 or 201. Alternatively, in cases where there are less fingers in a given varactor, the fingers may be wider than shown in either compound varactors 200 or 201. In these embodiments, the wider fingers may result in lower series resistance in the fingers, which may benefit performance. However, the wider electrodes may also mean an increase in the mean propagation distance in the collector/sub-collector, which in turn may result in an effective increase in the collector resistance. This increased resistance may result in a negative impact on the quality factor Q of the device. Thus, the optimum device layout may be a compromise between loss mechanisms in the varactor, as described above. Factors that may change based on this compromise may include the materials used in the compound varactor, the level of dopant of the collector/sub-collector layer, the length or width of the fingers, the overall size of the compound varactor, or other factors.

Figure 3:
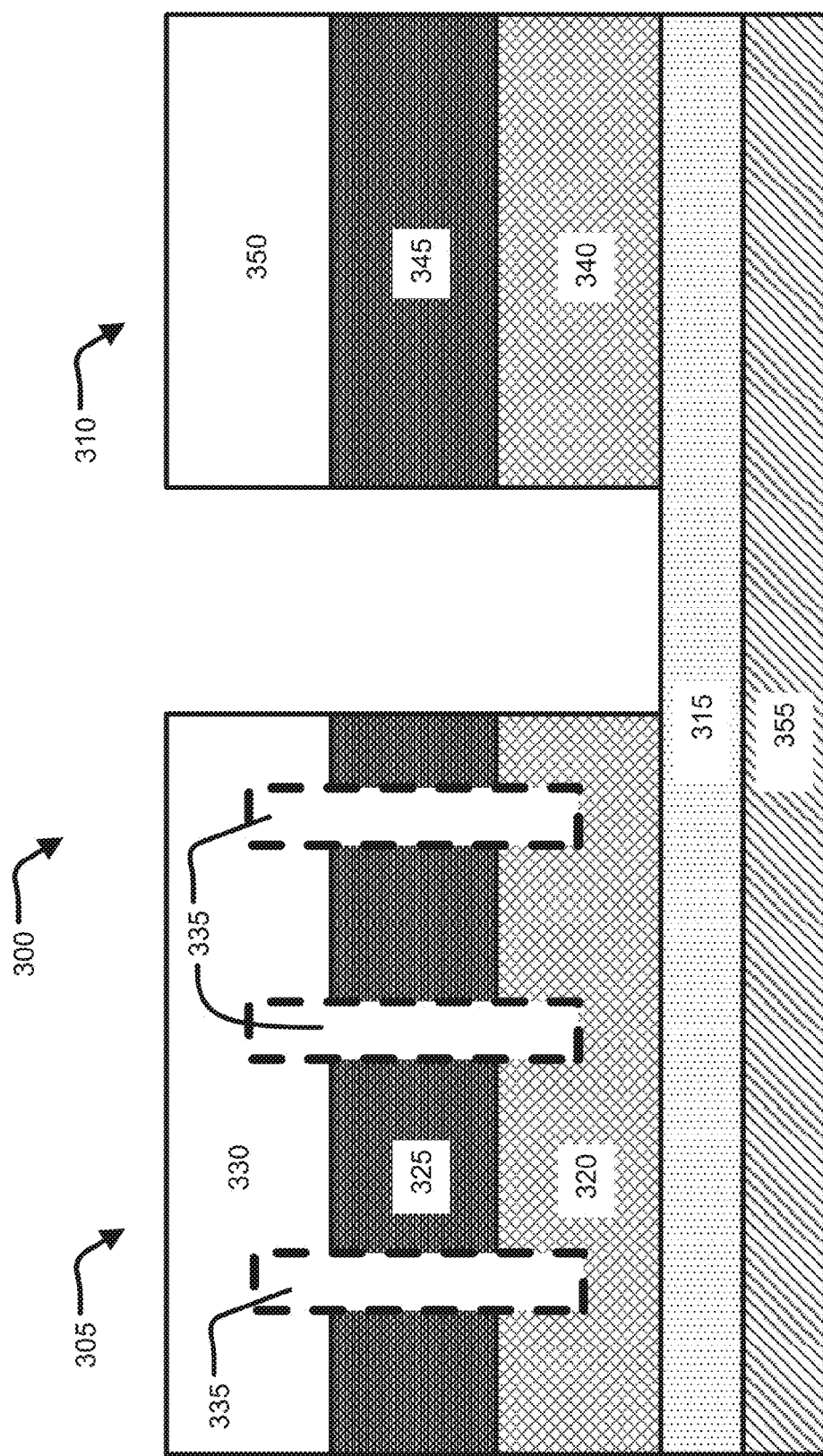
FIG. 3 illustrates a cut-away view of the series-connected pair of equal reverse-connected varactors of FIG. 2b, in accordance with various embodiments.

FIG. 3 illustrates an example side view of a compound varactor 300 such as compound varactor 200, taken along line A-A of FIG. 2b. It will be understood that the compound varactor 300 of FIG. 3 is intended as an example to show the relative positions of certain elements of FIG. 2b along the z-axis. As such, relative heights, lengths, or widths of elements of FIG. 3 should not be considered as definitive unless explicitly defined as such below.

In embodiments, the compound varactor 300 may include two varactors 305 and 310, which may be similar to compound varactors 205 and 210. In embodiments, the varactors 305 and 310 may both include a collector layer 315, which may be similar to collector layer 215 of FIG. 2b. Varactor 305 may include a base layer 320 and metal layers 325 and 330, which may be respectively similar to base layer 220 and metal layers 225 and 230 of FIG. 2b. In embodiments, varactor 305 may further include one or more vias 335, which may be similar to vias 235 and configured to communicatively couple one or more of the base layer 320 or metal layers 225 or 230 to one another.

Similarly to varactor 305, varactor 310 may include a base layer 340 and metal layer 345 and 350, which may be respectively similar to base layer 240 and metal layers 245 and 250. In some embodiments, the compound varactor 300 may include a sub-collector layer 355 coupled with the collector layer 315, which may be similar to the sub-collector layer that is described above, but not shown, with respect to compound varactor 200.

In some cases, as illustrated in FIG. 1a, 1b, or 1c, stacking of more than two varactor diodes may be desirable to meet linearity requirements of a circuit or apparatus using compound varactors. In some cases, more than one pair of interdigitated varactors may readily be stacked in series to achieve multi-varactor configurations such as those shown in FIG. 1a, 1b, or 1c.

Figure 5A:
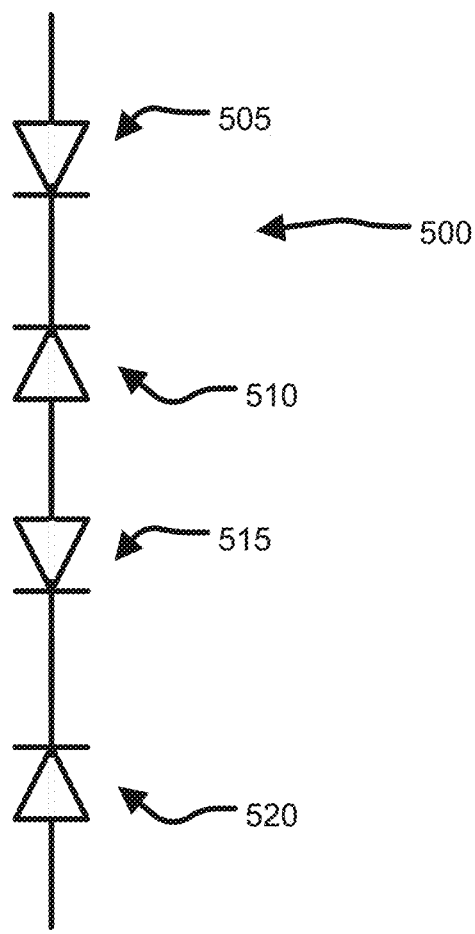
FIG. 5a illustrates a simplified example of a circuit that includes a series-connected pair of reverse-connected varactors, in accordance with various embodiments.

FIG. 5a shows a simple circuit diagram of a circuit 500 that includes four varactors 505, 510, 515, and 520, which may be similar to varactors 105, 145, or 150. Specifically, varactors 505 and 510 may be a first compound varactor that includes an interdigitated varactor pair, and varactors 515 and 520 may be a second compound varactor that includes an interdigitated varactor pair. In some embodiments, varactors 505, 510, 515, and 520 may be identical to one another. In other embodiments, one or more of varactors 505, 510, 515, and 520 may be different from another of the varactors. For example, in some embodiments varactor 505 may have relatively narrow fingers such as those shown with respect to varactor 206 in FIG. 2c, while varactor 510 may have relatively wide fingers such as those shown with respect to varactor 211 in FIG. 2c (or vice-versa). Similarly, if varactor 510 has relatively wide fingers, then varactor 515 may have relatively wide fingers and varactor 520 may have relatively narrow fingers (or vice-versa). In some embodiments, if varactor 510 has relatively wide fingers, then varactor 515 may have relatively narrow fingers and varactor 520 may have relatively wide fingers.

Additionally, in some embodiments circuit 500 may include one or more resistors such as resistors 135, a ground connection such as ground 120, a DC power source such as power source 125, an input terminal such as input terminal 110, and/or an output terminal such as output terminal 115.

Figure 5B:
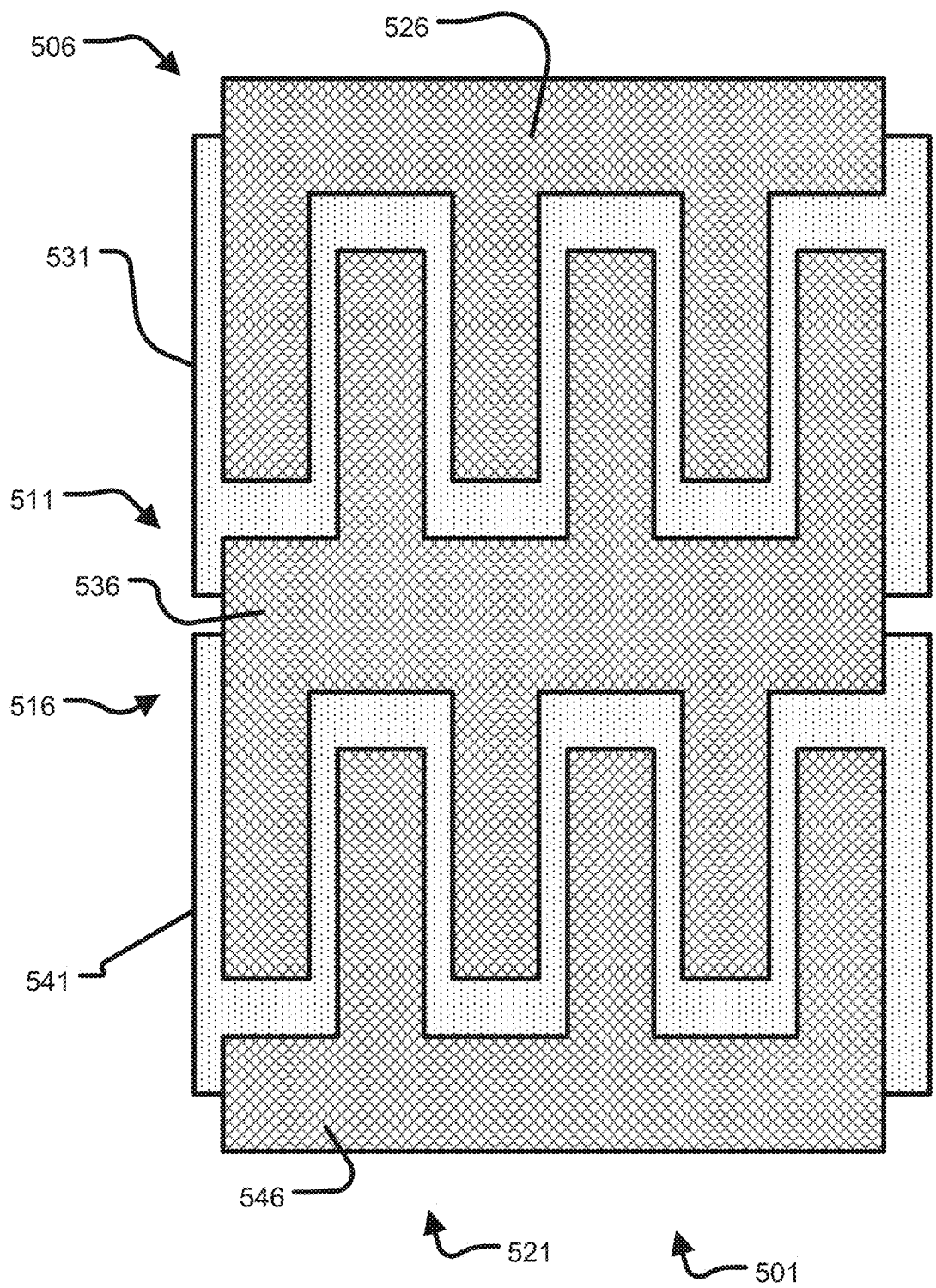
FIG. 5b illustrates a series connection of two series-connected pairs of equal reverse-connected varactors that may be used in the circuit of FIG. 5a, in accordance with various embodiments.

FIG. 5b illustrates a series connection of two series-connected pairs of equal reverse-connected varactors that may be used in the circuit of FIG. 5a, in accordance with various embodiments. Specifically, FIG. 5b illustrates a compound varactor 501 that may include four varactors 506, 511, 516, and 521 in a series connection with one another. Varactor 506 may include collector layer 531 and base layer 526, which may be similar to collector layer 215 and base layer 220 of FIG. 2b. Varactor 511 may include collector layer 531, and base layer 536, which may be similar to base layer 240 of FIG. 2b. Varactor 516 may include collector layer 541, which may also be similar to collector layer 215, and base layer 536. Finally, varactor 521 may include collector layer 541 and base layer 546, which may be similar to base layer 240 of FIG. 2b. In embodiments, one or more of varactors 506, 511, 516, and 521 may include one or more metal layers, a sub-collector layer, or vias, which are not illustrated in FIG. 5b for the sake of clarity. In operation, a signal may flow from varactor 506 through the compound varactor 501 and exit the compound varactor 501 at varactor 521 (or vice-versa). Although each of the varactors in compound varactor 501 are shown as having only three fingers, in other embodiments the varactors in compound varactor 501 may have more or less fingers.

Figure 5C:
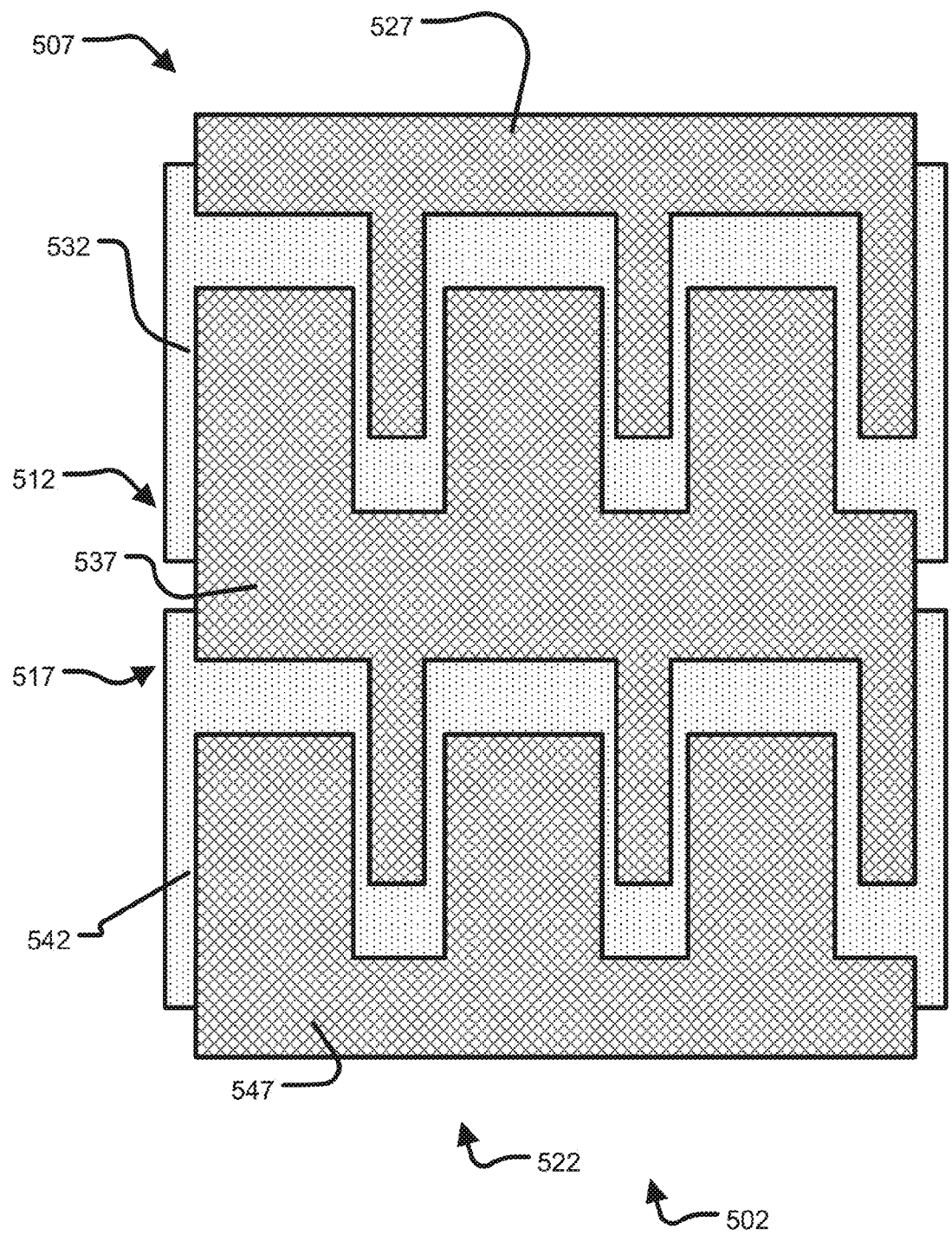
FIG. 5c illustrates a series connection of two series-connected pairs of non-equal reverse-connected varactors that may be used in the circuit of FIG. 5a, in accordance with various embodiments.

FIG. 5c illustrates a series connection of two-series-connected pairs of non-equal reverse-connected varactors that may be used in the circuit of FIG. 5a, in accordance with various embodiments. Specifically, FIG. 5c illustrates a compound varactor 502 that may include four varactors 507, 512, 517, and 522 in a series connection with one another. Varactor 507 may include collector layer 532 and base layer 527, which may be similar to collector layer 216 and base layer 221 of FIG. 2c. Varactor 512 may include collector layer 532, and base layer 537, which may be similar to base layer 241 of FIG. 2c. Varactor 517 may include collector layer 542, which may also be similar to collector layer 216, and base layer 537. Finally, varactor 522 may include collector layer 542 and base layer 547, which may be similar to base layer 241 of FIG. 2c. In embodiments, one or more of varactors 507, 512, 517, and 522 may include one or more metal layers, a sub-collector layer, or vias, which are not illustrated in FIG. 5c for the sake of clarity. In operation, a signal may flow from varactor 507 through the compound varactor 502 and exit the compound varactor 502 at varactor 522 (or vice-versa). Although the fingers of varactors 507 and 522 are shown as relatively narrow and the fingers of varactors 512 and 517 are shown as relatively wide, in other embodiments the fingers of varactors 507 and 522 may be relatively wide, and the fingers of varactors 512 and 517 may be relatively narrow. Although each of the varactors in compound varactor 502 are shown as having only three fingers, in other embodiments the varactors in compound varactor 502 may have more or less fingers.

While functional, the simple stacking architectures of compound varactors 501 and 502 may experience energy from a signal flowing through the compound varactors 501 and 502 flowing transversely along the horizontal busbars of the varactors 501 and 502. This energy may flow transversely along the horizontal busbars because of the vertical discontinuities of base layer 537. Specifically, a signal flowing vertically (as seen in the FIG. 5b or 5c) may flow into varactor 511 or 512, but then have to flow horizontally through base layer 536 or 537 to the fingers of varactors 516 or 517.

Figure 5D:
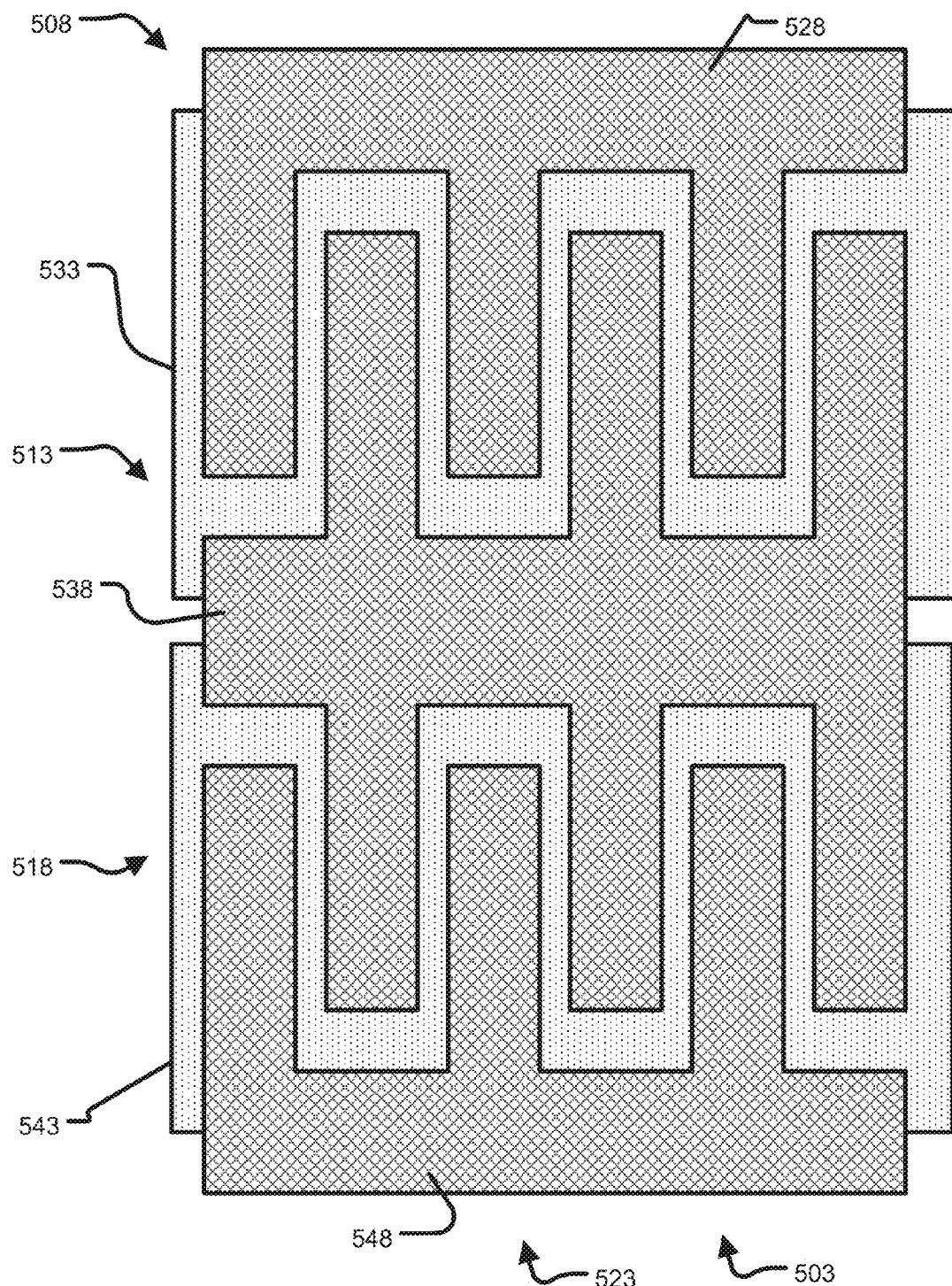
FIG. 5d illustrates an alternative series connection of two series-connected pairs of equal reverse-connected varactors that may be used in the circuit of FIG. 5a, in accordance with various embodiments.

FIG. 5d illustrates an alternative series connection of two-series-connected pairs of equal reverse-connected varactors that may be used in the circuit of FIG. 5a, in accordance with various embodiments. Specifically, FIG. 5d illustrates a compound varactor 503 that may include four varactors 508, 513, 518, and 523 in a series connection with one another. Varactor 508 may include collector layer 533 and base layer 528, which may be similar to collector layer 215 and base layer 220 of FIG. 2b. Varactor 513 may include collector layer 533, and base layer 538, which may be similar to base layer 240 of FIG. 2b. Varactor 518 may include collector layer 543, which may also be similar to collector layer 215, and base layer 538. Finally, varactor 523 may include collector layer 543 and base layer 548, which may be similar to base layer 240 of FIG. 2b. In embodiments, one or more of varactors 508, 513, 518, and 523 may include one or more metal layers, a sub-collector layer, or vias, which are not illustrated in FIG. 5d for the sake of clarity. In operation, a signal may flow from varactor 508 through the compound varactor 503 and exit the compound varactor 503 at varactor 523 (or vice-versa). Although each of the varactors in compound varactor 503 are shown as having only three fingers, in other embodiments the varactors in compound varactor 503 may have more or less fingers.

In embodiments, the signal may experience less loss in compound varactor 503 than, for example, compound varactor 501 because the fingers of varactors 513 and 518 may be vertically aligned with one another, as shown in FIG. 5d. Therefore, if the signal is flowing vertically through compound varactor 503, then the signal may not have to flow transversely through base layer 538 to move from the fingers of varactor 513 to the fingers of varactor 518.

Figure 5E:
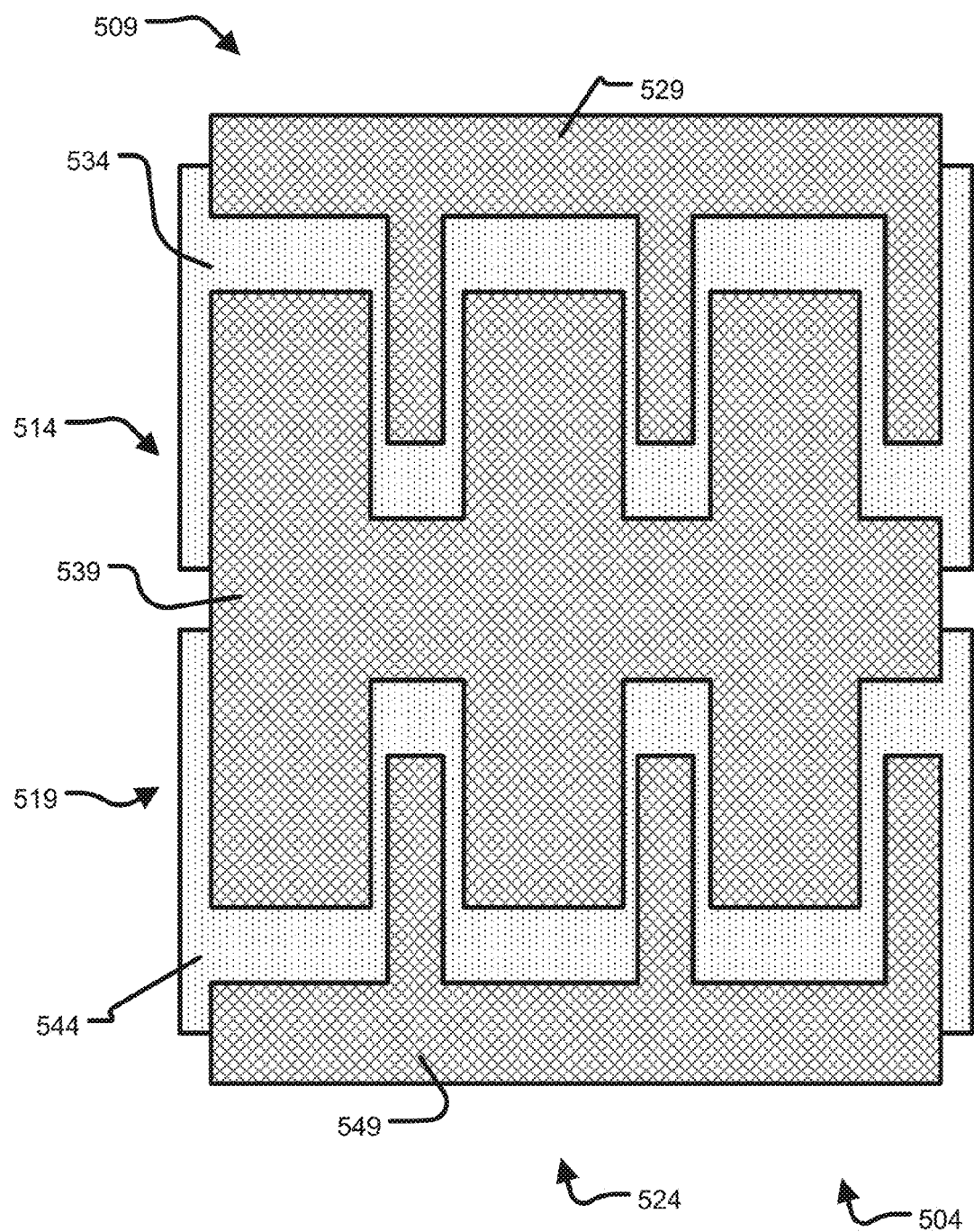
FIG. 5e illustrates an alternative series connection of two series-connected pairs of non-equal reverse-connected varactors that may be used in the circuit of FIG. 5a, in accordance with various embodiments.

FIG. 5e illustrates an alternative series connection of two-series-connected pairs of non-equal reverse-connected varactors that may be used in the circuit of FIG. 5a, in accordance with various embodiments. Specifically, FIG. 5e illustrates a compound varactor 503 that may include four varactors 509, 514, 519, and 524 in a series connection with one another. Varactor 509 may include collector layer 534 and base layer 529, which may be similar to collector layer 216 and base layer 221 of FIG. 2c. Varactor 514 may include collector layer 534, and base layer 539, which may be similar to base layer 241 of FIG. 2c. Varactor 519 may include collector layer 544, which may also be similar to collector layer 216, and base layer 539. Finally, varactor 524 may include collector layer 544 and base layer 549, which may be similar to base layer 241 of FIG. 2c. In embodiments, one or more of varactors 509, 514, 519, and 524 may include one or more metal layers, a sub-collector layer, or vias, which are not illustrated in FIG. 5e for the sake of clarity. In operation, a signal may flow from varactor 509 through the compound varactor 504 and exit the compound varactor 504 at varactor 524 (or vice-versa). Although the fingers of varactors 509 and 524 are shown as relatively narrow and the fingers of varactors 514 and 519 are shown as relatively wide, in other embodiments the fingers of varactors 509 and 524 may be relatively wide, and the fingers of varactors 514 and 519 may be relatively narrow. Although each of the varactors in compound varactor 504 are shown as having only three fingers, in other embodiments the varactors in compound varactor 504 may have more or less fingers.

Similarly to compound varactor 503, a signal flowing through compound varactor 504 may experience less loss in compound varactor 504 than, for example, compound varactor 502 because the fingers of varactors 514 and 519 may be vertically aligned with one another, as shown in FIG. 5e. Therefore, if the signal is flowing vertically through compound varactor 504, then the signal may not have to flow transversely through base layer 539 to move from the fingers of varactor 514 to the fingers of varactors 519.

Figure 6A:
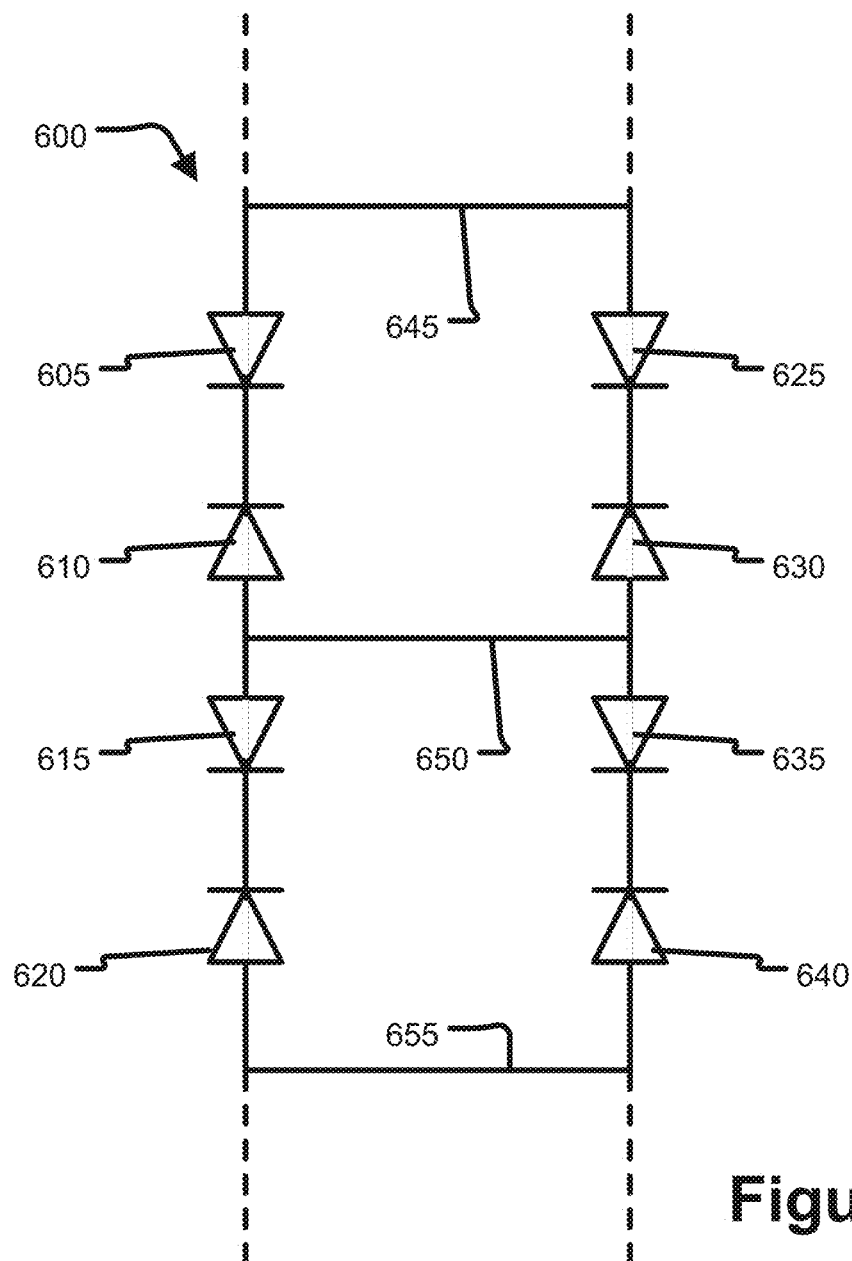
FIG. 6a illustrates a simplified example of a circuit that includes a plurality of series-connected pairs of reverse-connected varactors, in accordance with various embodiments.

In some embodiments, an anti-parallel pair of stacked diodes may be beneficial as shown in FIG. 6a. Specifically, as mentioned above, in some uses dual interconnected varactor stacks may be advantageous. Such a circuit could be desirable, for example, because in some embodiments parallel asymmetric varactor stacks with non-equal capacitance ratios may increase linearity. Additionally, an interdigitated reverse-connected varactor pair configuration may be particularly space-efficient in realizing such dual stacked pairs.

FIG. 6a depicts a high-level circuit diagram of a circuit 600 that includes two sets of series-stacked varactors. Specifically, the circuit 600 may include varactors 605, 610, 615, 620, 625, 630, 635, and 640, which may be similar to varactors 105, 145, and/or 150. In embodiments, certain of the varactors such as varactors 605 and 610 may be front-to-front with one another, while others of the varactors such as varactors 610 and 615 may be back-to-back with one another. In embodiments, the stacks may be connected to one another via interconnects such as interconnects 645, 650, and 655.

In some embodiments, each of the varactors 605, 610, 615, 620, 625, 630, 635, and 640 may be similar to one another, for example having similar finger width or constructed of the same materials. In other embodiments, at least one of varactors 605, 610, 615, 620, 625, 630, 635, and 640 may be different from another one of the varactors, for example having a different finger width or being constructed of a different material from the other varactor. In some embodiments, varactors 605, 620, 630, and 635 may be similar to one another, but different from varactors 610, 615, 625, and 640 (which may be similar to one another).

Although not shown for the sake of simplicity, in some embodiments circuit 600 may include more or fewer varactors than are shown in FIG. 6a. Additionally, in some embodiments circuit 600 may include one or more resistors such as resistors 135, a ground connection such as ground 120, a DC power source such as power source 125, an input terminal such as input terminal 110, and/or an output terminal such as output terminal 115.

Figure 6B:
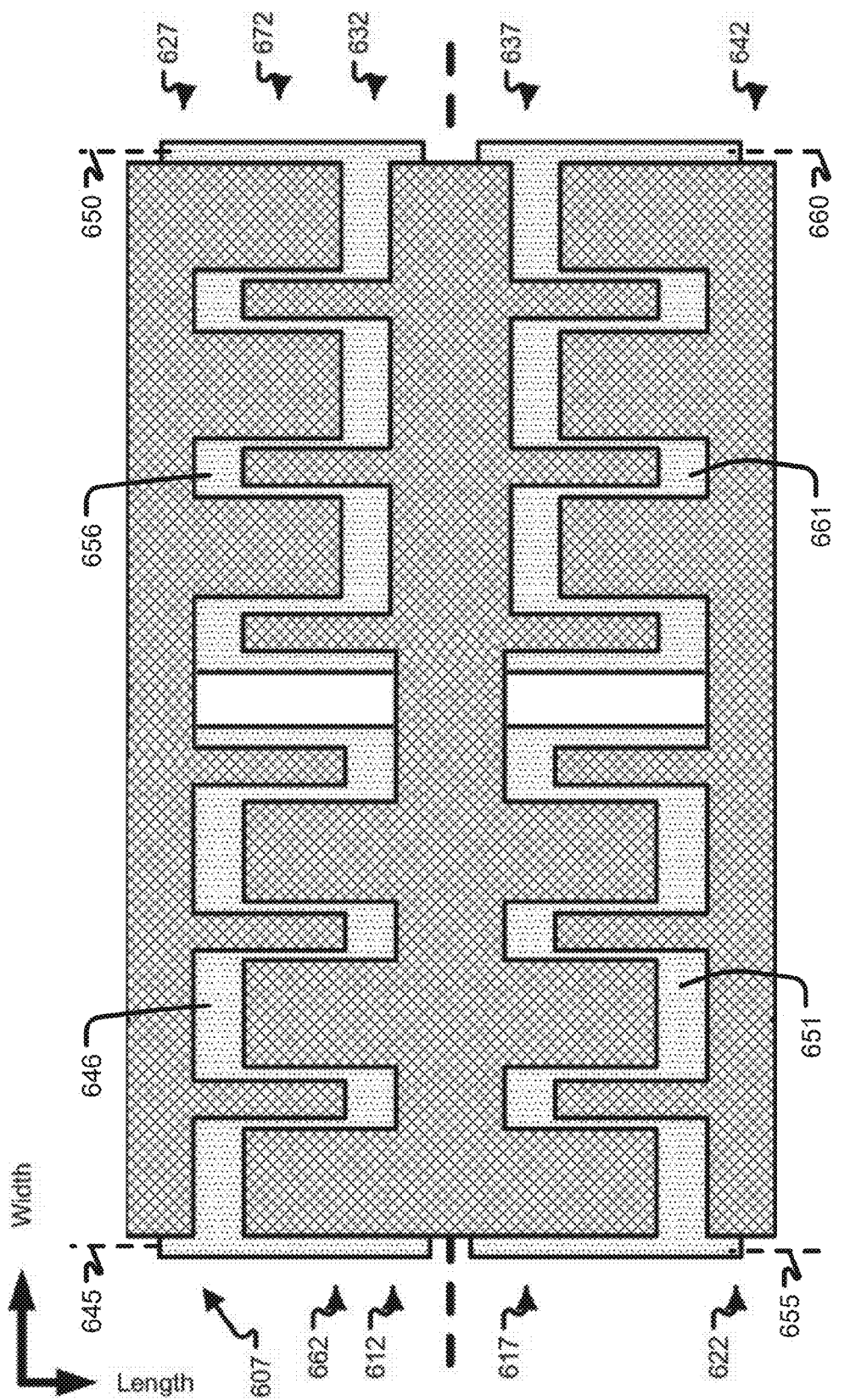
FIG. 6b illustrates an example a plurality of series-connected pairs of non-equal reverse-connected varactors that may be used in the circuit of FIG. 6a, in accordance with various embodiments.

FIG. 6b illustrates an example a plurality of series-connected pairs of non-equal reverse-connected varactors that may be used in the circuit of FIG. 6a, in accordance with various embodiments. Specifically, FIG. 6b depicts a compound varactor 602 that includes two varactor stacks 662 and 672 of varactors that are in series with one another as shown in FIG. 6a. In embodiments, varactor stacks 662 and 672 may be in parallel with one another.

Specifically, stack 662 may include varactors 607, 612, 617, and 622, which may be similar to varactors 509, 514, 519, and 524, respectively. Similarly, stack 672 may include varactors 627, 632, 637, and 642, which may also be similar to varactors 509, 514, 519, and 524, respectively. In embodiments, the base layers of stacks 662 and 672 may be coupled with one another as shown in FIG. 6b. Varactors 607 and 612 may share collector layer 646. Varactors 617 and 622 may share collector layer 651. Varactors 627 and 635 may share collector layer 656. Varactors 637 and 642 may share collector layer 661.

As shown, in some embodiments the configurations of the stacks 662 and 672 may be different. For example, the "inner" varactors 612 and 617 of stack 662 may have relatively wide fingers, while the "outer" varactors 607 and 622 of stack 662 may have relatively narrow fingers. By contrast, in stack 672 the "inner" varactors 632 and 637 may have relatively narrow fingers while the "outer" varactors 627 and 642 may have relatively wide fingers. In other embodiments, the widths of the "inner" fingers of the fingers of stack 662 and the "outer" fingers of stack 672 may be relatively narrow while the widths of the "inner" fingers of the stack 672 and the "outer" fingers of the stack 662 may be relatively wide. As described herein, "inner" and "outer" are only intended as descriptive elements to identify the different fingers of the different varactors in FIG. 6b, and are not intended as limiting or definitional elements.

In some embodiments, the collector layers of the compound varactors may be coupled with one or more DC power sources such as DC power source 125 that may be configured to provide a DC voltage bias. Specifically, collector layers 646, 651, 656, and 661 may be coupled with a DC power source via interconnects 645, 655, 650, and 660, respectively. In some embodiments, one or more resistors such as resistors 135 may be positioned between one or more of the collector layers 646, 651, 656, and 661 and the DC power source. In embodiments, the various varactors of compound varactor 602 may include one or more of vias, metal layers, or sub-collector layers, which are not shown in FIG. 6b for the sake of clarity. Although the varactors of compound varactor 602 are shown with three fingers each, in other embodiments the varactors may have a greater or lesser number of fingers. Similarly, it can be seen that the fingers of the base layers of varactors 612, 617, 632, and 637 are wider than the fingers of the base layers of varactors 607, 622, 627, and 642. In other embodiments, the fingers of the base layers of varactors 612, 617, 632, and 637 may be narrower than the fingers of the base layers of varactors 607, 622, 627, and 642.

Figure 6C:
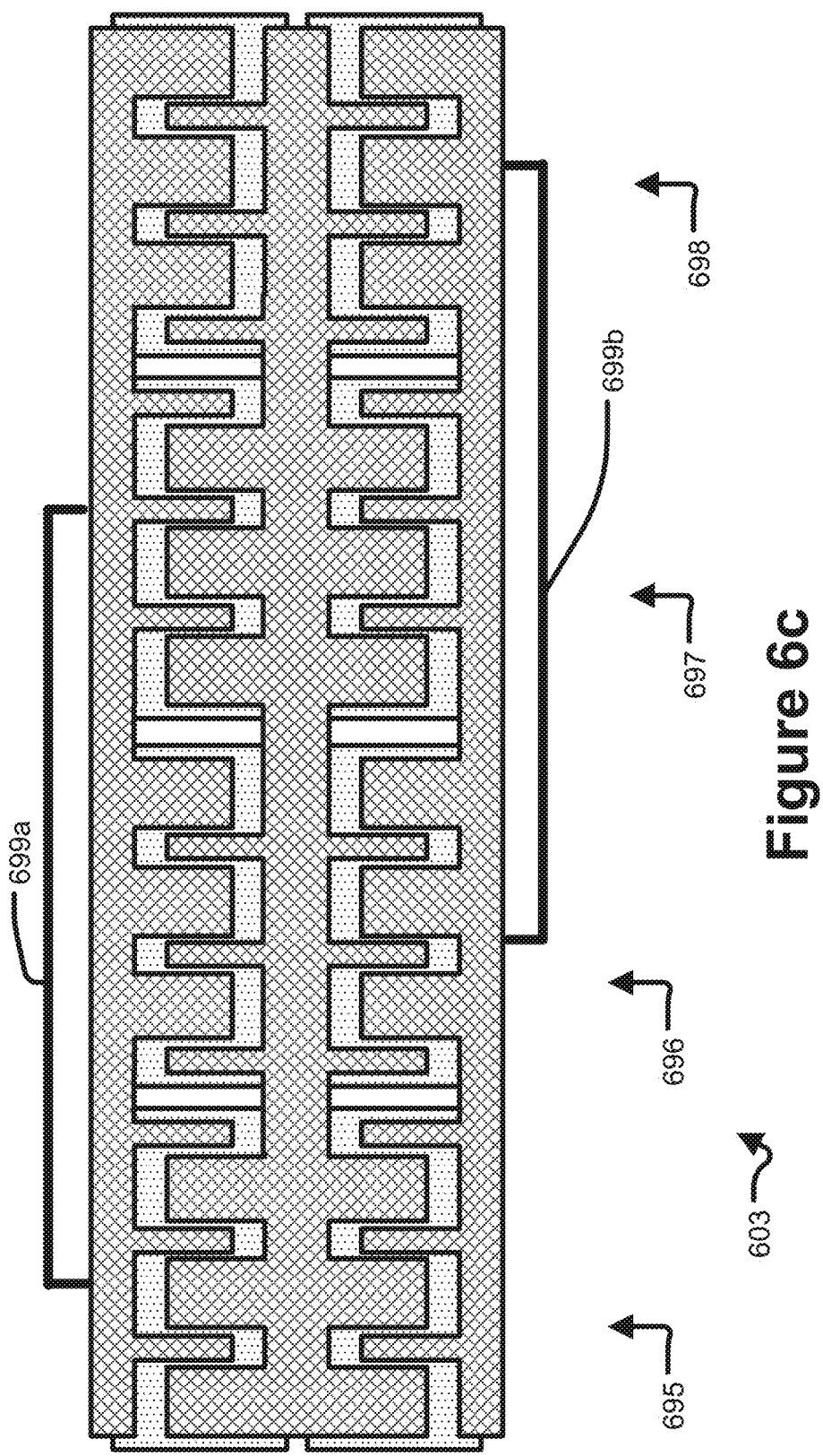
FIG. 6c illustrates an alternative example of a plurality of series-connected pairs of non-equal reverse-connected varactors that may be used in the circuit of FIG. 6a, in accordance with various embodiments.

FIG. 6c illustrates an alternative example of a plurality of series-connected pairs of non-equal reverse-connected varactors that may be used in the circuit of FIG. 6a, in accordance with various embodiments. Specifically, the dual stack architecture of FIG. 6a or 6b may result in significantly increased linearity for a signal propagating through the compound varactor. Non-linear artifacts from the two stacks may cancel each other via the interconnects between the two stacks. However, if each of the stacks has a wide aspect ratio, which may be desirable as required for increasing or maximizing the quality factor Q of the compound varactor, then resistance and inductance in the horizontal connections between the stacks may inhibit the cancellation of the spurious artifacts. To reduce any such degradation in performance, the left and right stacks may be broken up into sub-sections, or segmented, and interspersed with one another as illustrated in FIG. 6c.

Specifically, FIG. 6c illustrates a compound varactor 603 that may consist of four stacks of series varactors. The stacks may be similar to stacks 662 or 672, but they may be segmented versions of stacks such as stacks 662 or 672. Specifically, stacks 695 and 697 may be a segmented version of a stack such as stacks 662 or 672, and stacks 696 and 698 may be a segmented version of a stack such as stacks 662 or 672.

For example, even though the varactors of stacks 695, 696, 697, or 698 are shown as having three fingers each, the number of fingers is shown simply as an example and is not intended to be determinative. In some embodiments, because stacks 695 and 697 are segmented portions of one of the stacks shown in FIG. 6a, the number of fingers of varactors in stacks 695 and 697 combined may be equal to the number of fingers of varactors in stack 662. In other words, stack 662 may be segmented to form stacks 695 and 697. Similarly, stacks 696 and 698 may be a segmented version of other stacks described herein.

In embodiments, the collector layers (not labeled for the sake of clarity) of elements of a single segmented stack may be coupled to one another. For example, stacks 695 and 697 may be segmented elements of a stack such as stack 662, as described above. The collector layers of stacks 695 and 697 may be coupled together by interconnect 699a, which may be similar to one of interconnects 645, 650, 655, or 660, and further coupled with a DC power source as described above with respect to FIG. 6b. Similarly, the collector layers of stacks 696 and 698 may be coupled together by interconnect 699b. By coupling the collector layers of stacks 695 and 697, or 696 and 698, together, a similar DC voltage bias may be applied to both segmented elements of a stack.

It may further be seen that the varactors of the various stacks of compound varactor 603 may be unequal, that is having different finger widths, similarly to compound varactor 602 of FIG. 6b. Additionally, the fingers widths of the varactors of the stacks may not vary in the same pattern. Specifically, as can be seen the outer varactors of stacks 695 and 697 have relatively narrow fingers, while the inner varactors of stacks 695 and 697 have relatively wider fingers. By contrast, the outer varactors of stacks 696 and 698 have relatively wide fingers, while the inner varactors of stacks 696 and 698 have relatively narrow fingers. By segmenting the various stacks of the compound varactor circuit of FIG. 6a, and interleaving the segmented stacks, the second-order non-linear components of the RF signal may be reduced or minimized.

Figure 7:
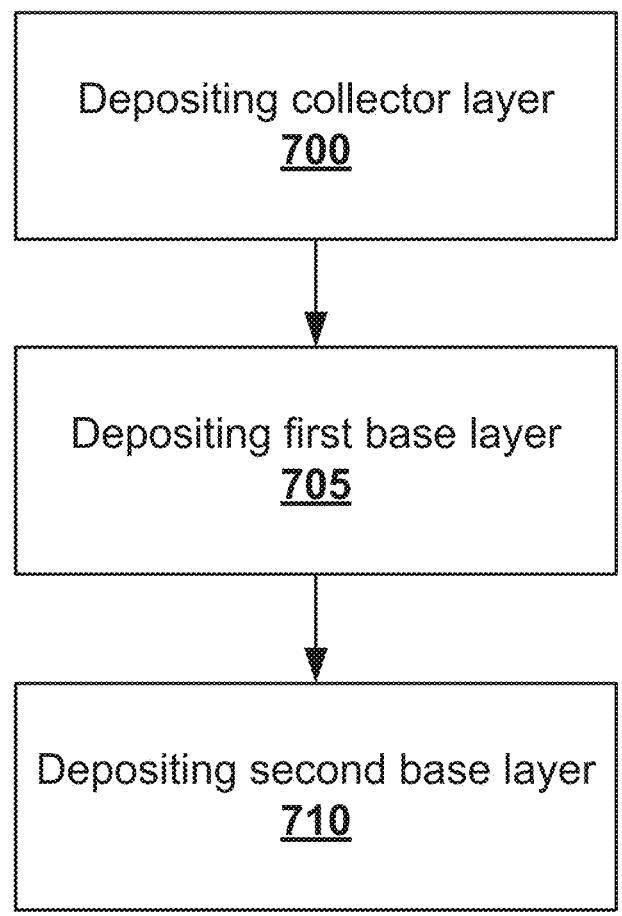
FIG. 7 illustrates a process for constructing a compound varactor, in accordance with various embodiments.

FIG. 7 depicts an example process for generating a compound varactor such as compound varactor 200. Initially, a collector layer such as collector layer 215 may be deposited at 700. Next, a base layer such as base layer 220 may be deposited on the collector layer 215 at 705. Finally, a base layer such as base layer 240 may be deposited on the collector layer 215 at 710.

As described herein, the deposition of the base layers at 710 and 715 may include depositing the base layer to form fingers such as fingers 260 or 270. In some embodiments, the base layer may be deposited and then etched to form the fingers by mechanical, electrical, or chemical etching. In some embodiments, only a single base layer may be deposited and then etched to form the fingers of the two varactors 205 and 210 in the compound varactor 200. In some embodiments, additional layers such as the sub-collector layer or one or more of the metal layers as described above may be deposited and/or etched.

Figure 8:
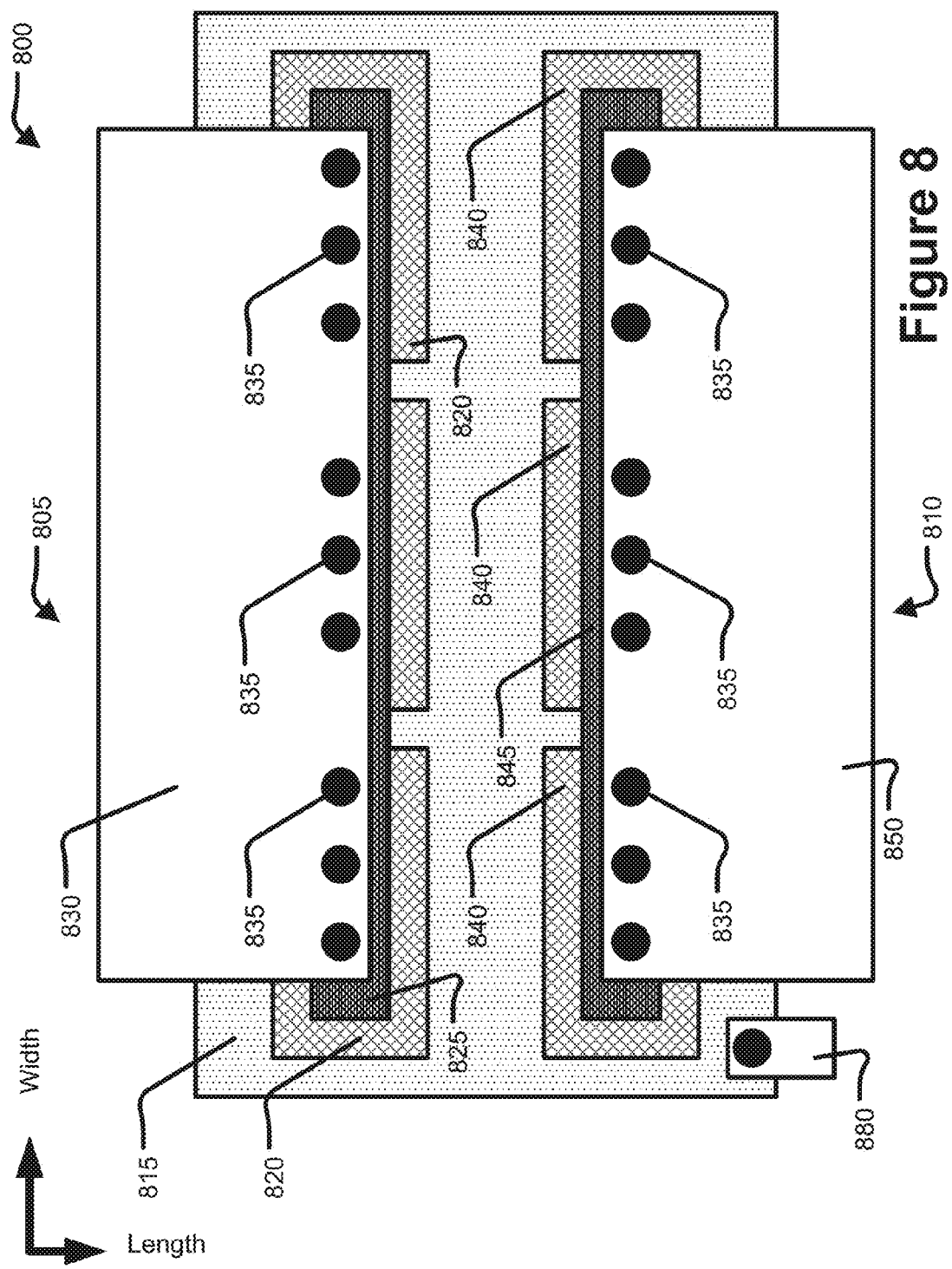
FIG. 8 illustrates an alternative overhead view of a compound varactor, in accordance with various embodiments.

FIG. 8 depicts an alternative embodiment of a compound varactor 800 that may include elements that are similar to elements of compound varactor 200, and are labeled similarly. For example, compound varactor 800 may include varactors 805 and 810. Varactor 805 may include the collector layer 815, one or more base layers 820, one or more metal layers 825, and a second metal layer 830 which may be respectively similar to collector layer 215, base layer 220, metal layer 225, and metal layer 230. In embodiments, vias 835 may electrically connect one or more of base layer 820, metal layer 825, and metal layer 830.

Similarly, varactor 810 may include the collector layer 815, one or more base layers 840, one or more metals layers 845, and a metal layer 850 that may be respectively similar to base layer 240, metal layer 245, and metal layer 250. In embodiments, vias 835 may electrically connect one or more of base layers 840, metal layer 845, and metal layer 850. As can be seen in FIG. 8, in embodiments the base layers 820 and 840 may not be formed as fingers, but instead be formed as discrete elements that are arranged generally opposite one another. In embodiments, the base layers 820 and 840 may be generally joined by metal layers 825, 830, 845, and/or 850, as shown in FIG. 8.

The collector layer 815 may be coupled with a bias input 880 that may be coupled with and configured to receive a voltage bias from, for example, DC power source 125. In some embodiments, the collector layer 815 may further include or be coupled with a sub-collector layer (not shown).

Also, in some embodiments, the different sizes or number of elements may be different than depicted in FIG. 8. For example, the metal layer 830 may have a generally similar width to the total width of the base layer 820, rather than being slightly narrower as depicted in FIG. 8. Additionally, in some embodiments the compound varactor 800 may include more or fewer base layers 820 or 840, or vias 835.

Figure 9:
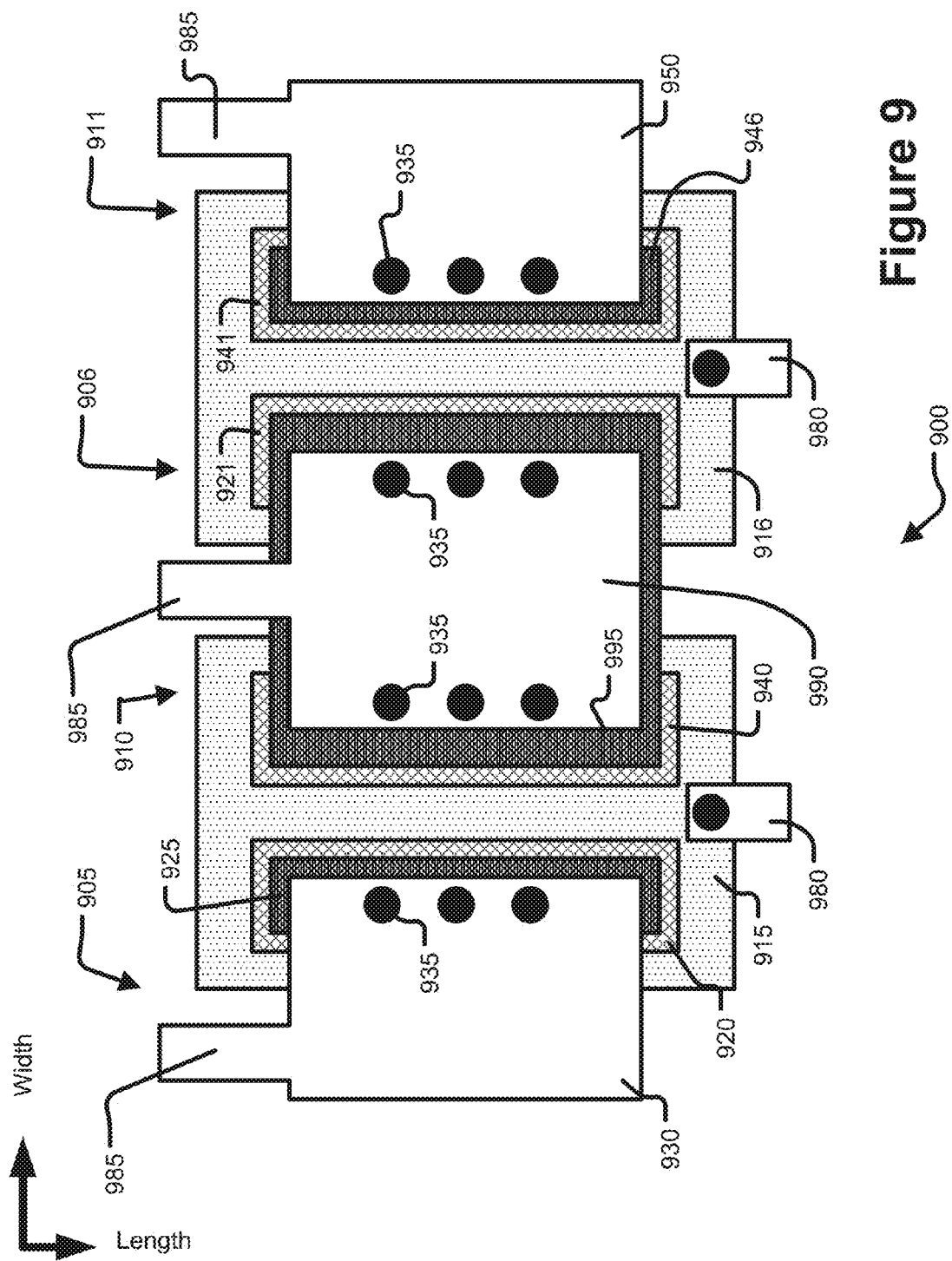
FIG. 9 illustrates an alternative overhead view of a system that includes a plurality of compound varactors, in accordance with various embodiments.

FIG. 9 depicts an alternative embodiment that includes a compound varactor 900. Elements of FIG. 9 may be similar to elements of FIG. 2, and numbered similarly. Varactor 905 may include collector layer 915, base layer 920, metal layer 925, and metal layer 930, which may be respectively similar to collector layer 215, base layer 220, metal layer 225, and metal layer 230. In embodiments, vias 935, which may be similar to vias 235, may electrically connect one or more of base layer 920, metal layer 925, and metal layer 930. Varactor 910 may include collector layer 915 and base layer 940, which may be similar to collector layer 215 and base layer 240. Varactor 910 may further include metal layers 995 and 990, as described in further detail below. In embodiments, vias 935 may electrically connect one or more of base layer 940, metal layer 995, and metal layer 990.

Varactor 906 may include collector layer 916 and base layer 921, which may be respectively similar to collector layer 215 and base layer 220. Varactor 906 may further include metal layers 990 and 995, as described in further detail below. In embodiments, vias 935 may electrically connect one or more of base layer 921, metal layer 990, and metal layer 995. Varactor 911 may include collector layer 916, base layer 941, metal layer 946, and metal layer 950, which may be respectively similar to collector layer 215, base layer 240, metal layer 245, and metal layer 250. In embodiments, vias 935 may electrically connect one or more of base layer 941, metal layer 946, and metal layer 950.

In some embodiments the collector layers 915 and 916 may be coupled with a bias input 980 that may be coupled with and configured to receive a voltage bias from, for example, DC power source 125. Additionally, in some embodiments each of metal layers 930, 990, and 950 may include a bias tab 985 that is configured to be coupled with, and receive a voltage bias from, a DC power source. In some embodiments, the collector layers 915 or 916 may include or be coupled with a sub-collector layer, as described above with reference to collector layer 215. In some embodiments, the number of different elements may be different than depicted in FIG. 9. For example, in embodiments the compound varactor 900 may include more or fewer collector layers, base layers, or metal layers. Additionally, in some embodiments the relative sizes of elements may be different than depicted in FIG. 9. For example, in some embodiments the metal layer 925 may be the same length or width as base layer 920.

As can be seen in FIG. 9, the metal layer 995, which may be similar to one or both of metal layers 225 or 245, may be an element of both varactors 910 and 906, and configured to allow an RF signal to propagate from varactor 910 to varactor 906, or vice versa. Similarly, metal layer 990, which may be similar to one or both of metal layers 230 or 250, may be an element of both varactors 910 and 906, and configured to allow an RF signal to propagate from varactor 910 to varactor 906, or vice versa.

Therefore, as shown in FIG. 9, an RF signal may enter compound varactor 900 at metal layer 930, where it may propagate through varactor 905 to collector layer 915. From collector layer 915, the RF signal may propagate through varactor 910 to metal layer 990 to varactor 906. The RF signal may then similarly propagate through compound varactor 901 to metal layer 950, where it may then exit system 900. It will be understood that this description of how an RF signal may propagate through compound varactor 900 is only intended as an example, and in other embodiments the RF signal may enter, exit, or propagate through different layers or in a different direction dependent on the specific construction of the compound varactor 900 or a circuit utilizing compound varactor 900.

Figure 10:
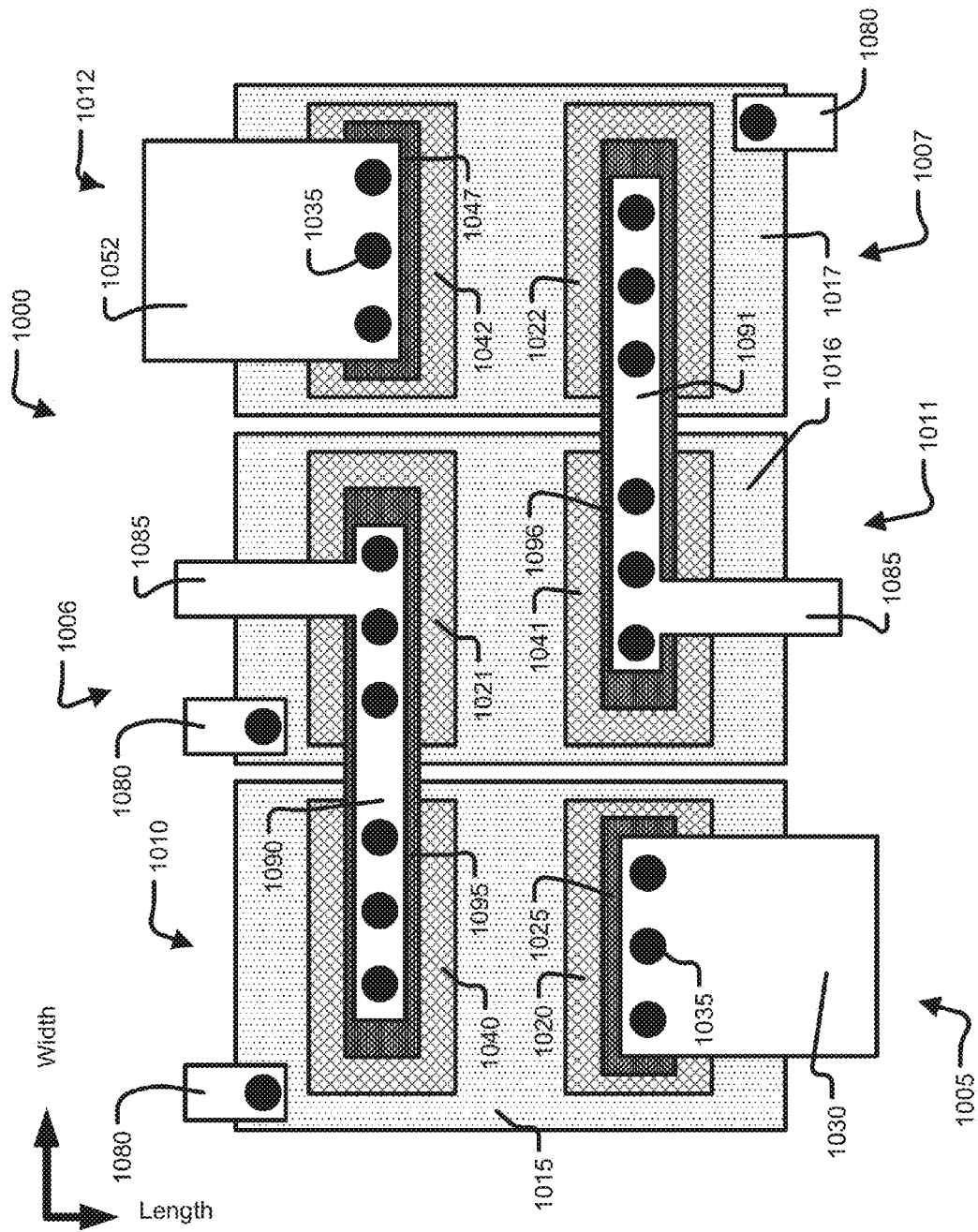
FIG. 10 illustrates an alternative overhead view of a system that includes a plurality of compound varactors, in accordance with various embodiments.

FIG. 10 depicts an alternative embodiment that includes a compound varactor 1000. Elements of compound varactor 1000 may be similar to compound varactor 200 or compound varactor 900, and be numbered similarly.

Varactor 1005 may include collector layer 1015, base layer 1020, metal layer 1025, and metal layer 1030, which may be respectively similar to collector layer 215, base layer 220, metal layer 225, and metal layer 230. In embodiments, vias 1035, which may be similar to vias 235, may electrically connect one or more of base layer 1020, metal layer 1025, and metal layer 1030. Varactor 1010 may include collector layer 1015 and base layer 1040, which may be respectively similar to collector layer 215 and base layer 240. Varactor 1010 may further include metal layer 1095 and metal layer 1090, which will be described in greater detail below. Vias (not labeled for the sake of clarity) may electrically connect base layer 1040, metal layer 1095, and metal layer 1090.

Varactor 1006 may include collector layer 1016 and base layer 1021, which may be respectively similar to collector layer 215 and base layer 220. Varactor 1006 may further include metal layers 1095 and 1090, as described in further detail below. Vias 1035 (not labeled for the sake of clarity) may electrically connect one or more of base layer 1021, metal layer 1095, and metal layer 1090. Varactor 1011 may include collector layer 1016 and base layer 1041, which may be respectively similar to collector layer 215 and base layer 240. In embodiments, varactor 1011 may further include metal layer 1096 and metal layer 1091, as described in further detail below. In embodiments, vias 235 (not labeled for the sake of clarity) may electrically connect one or more of base layer 1041, metal layer 1096, and metal layer 1091.

Varactor 1007 may include collector layer 1017 and base layer 1022, which may be respectively similar to collector layer 215 and base layer 220. Varactor 1007 may further include metal layers 1096 and 1091. Vias 1035 (not labeled for the sake of clarity) may electrically connect one or more of base layer 1022, metal layer 1096, and metal layer 1091. Varactor 1012 may include collector layer 1017, base layer 1042, metal layer 1047, and metal layer 1052, which may be respectively similar to collector layer 215, base layer 240, metal layer 245, and metal layer 250. In embodiments, vias 1035 may electrically connect one or more of base layer 1042, metal layer 1047, and metal layer 1052.

In some embodiments the collector layers 1015, 1016, and 1016 may be coupled with a bias input 1080 that may be coupled with and configured to receive a voltage bias from, for example, DC power source 125. Additionally, in some embodiments each of metal layers 1090 and 1091 may include a bias tab 1085 that is configured to be coupled with, and receive a voltage bias from, a DC power source. In some embodiments, the collector layers 1015, 1016, and 1017 may include or be coupled with a sub-collector layer, as described above with reference to collector layer 215. In some embodiments, the number of different elements may be different than depicted in FIG. 10. For example, in embodiments the compound varactor 1000 may include more or fewer collector layers, base layers, or metal layers. Additionally, in some embodiments the relative sizes of elements may be different than depicted in FIG. 10. For example, in some embodiments the metal layer 1025 may be the same length or width as base layer 1020.

As can be seen in FIG. 10, the metal layer 1095, which may be similar to one or both of metal layers 225 or 245, may be an element of both varactors 1010 and 1006, and configured to allow an RF signal to propagate from varactor 1010 to varactor 1006, or vice versa. Similarly, metal layer 1090, which may be similar to one or both of metal layers 230 or 250, may be an element of both varactors 1010 and 1006, and configured to allow an RF signal to propagate from varactor 1010 to varactor 1006, or vice versa. Similarly, metal layer 1091, which may be similar to metal layer 1090, may be an element of both varactors 1011 and 1007, and configured to allow an RF signal to propagate from varactor 1011 to varactor 1007, or vice versa. Similarly, metal layer 1091, which may be similar to one or both of metal layer 230 or 250, may be an element of both varactors 1011 and 1007, and configured to allow an RF signal to propagate from varactor 1011 to varactor 1007, or vice versa.

Therefore, as shown in FIG. 10, an RF signal may enter the system 1000 at metal layer 1030. The RF signal may propagate through varactor 1005 to collector layer 1015, where it may then propagate back up through varactor 1010 to metal layer 1090. The RF signal may propagate through metal layer 1090 to varactor 1006 where it may propagate through the compound varactor 1002 to metal layer 1091. From metal layer 1091, the RF signal may propagate to varactor 1007 to metal layer 1052 where it may then exit the compound varactor 1000. It will be understood that this description of how an RF signal may propagate through compound varactor 1000 is only intended as an example, and in other embodiments the RF signal may enter, exit, or propagate through different layers or in a different direction dependent on the specific construction of the compound varactor 1000 or a circuit utilizing compound varactor 1000.

Figure 11:
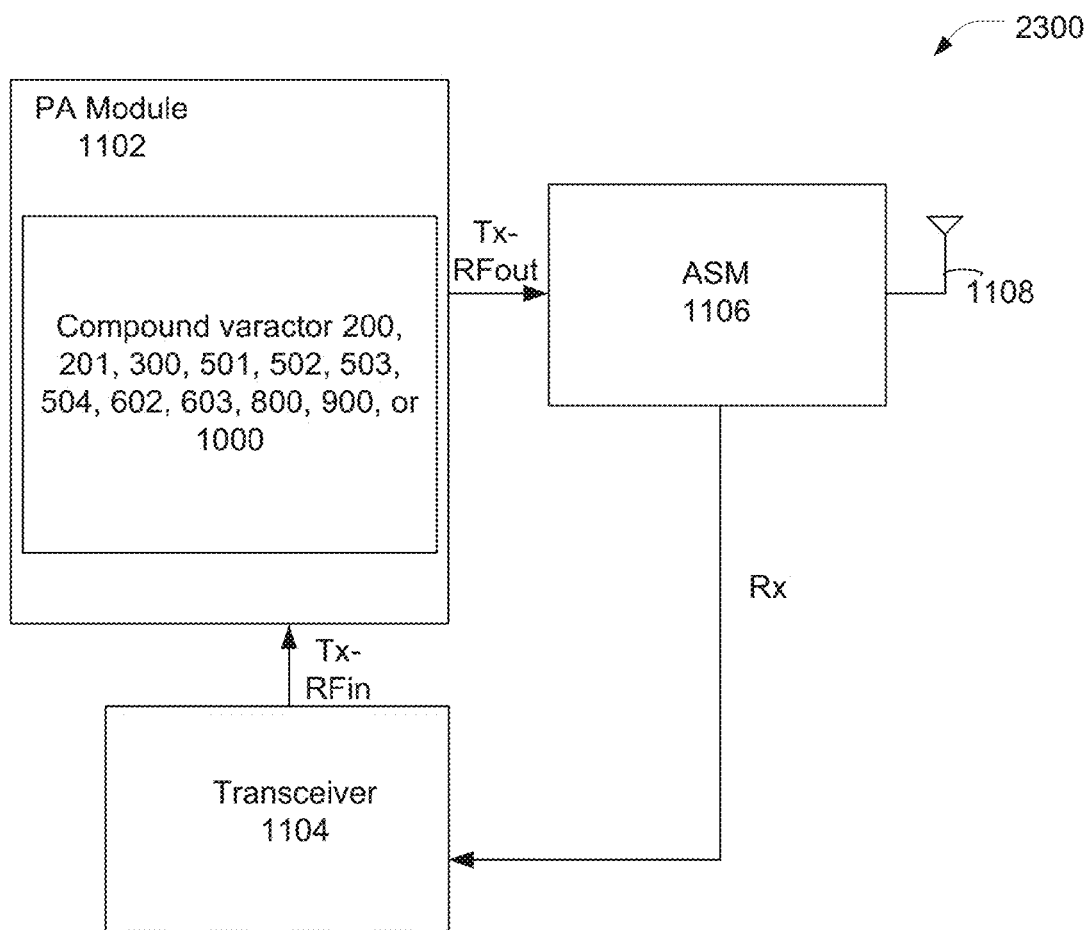
FIG. 11 is a block diagram of an exemplary wireless communication device, in accordance with various embodiments.

Compound varactors 200, 201, 300, 501, 502, 503, 504, 601, 602, 603, 800, 900, or 1000 may be incorporated into a variety of systems. A block diagram of an example system 1100 is illustrated in FIG. 11. As illustrated, the system 1100 includes a power amplifier (PA) module 1102, which may be a radio frequency (RF) PA module in some embodiments. The system 1100 may include a transceiver 1104 coupled with the PA module 1102 as illustrated. The PA module 1102 may include one or more of compound varactors 200, 201, 300, 501, 502, 503, 504, 601, 602, 603, 800, 900, or 1000. In various embodiments, the compound varactors 200, 201, 300, 501, 502, 503, 504, 601, 602, 603, 800, 900, or 1000 may additionally/alternatively be included in the transceiver 1104 to provide, e.g., up-converting, or in an antenna switch module (ASM) 1106 to provide various switching functions.

The PA module 1102 may receive an RF input signal, RFin, from the transceiver 1104. The PA module 1102 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 11.

The amplified RF output signal, RFout, may be provided to the ASM 1106, which effectuates an over-the-air (OTA) transmission of the RF output signal, RFout, via an antenna structure 1108. The ASM 1106 may also receive RF signals via the antenna structure 1108 and couple the received RF signals, Rx, to the transceiver 1104 along a receive chain.

In various embodiments, the antenna structure 1108 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 1100 may be suitable for any one or more of terrestrial and satellite communications, radar systems, and possibly in various 1100 and medical applications. More specifically, in various embodiments, the system 1100 may be a selected one of a radar device, a satellite communication device, a mobile computing device (e.g., a phone, a tablet, a laptop, etc.), a base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. An apparatus comprising:
   a first diode that includes a first base layer arranged in a first plurality of parallel fingers defining a first plurality of spaces, and a collector layer coupled with the first base layer;
   a first metal layer positioned on a side of the first base layer opposite the collector layer;
   a second metal layer positioned on a side of the first metal layer opposite the first base layer;
   a plurality of vias electrically coupling the first metal layer, the second metal layer, and the first base layer; and
   a second diode that includes a second base layer arranged in a second plurality of parallel fingers defining a second plurality of spaces, and also includes the collector layer, which is further coupled with the second base layer;
   wherein a first finger in the first plurality of parallel fingers is in a first space in the second plurality of spaces, and a second finger in the second plurality of parallel fingers is in a second space in the first plurality of spaces.

2. The apparatus of claim 1, wherein the first diode is a first varactor and the second diode is a second varactor.

3. The apparatus of claim 1, wherein the first metal layer or second metal layer includes titanium, platinum, gold, zinc, nickel, or beryllium.

4. The apparatus of claim 1, further comprising a sub-collector layer directly coupled with the collector layer on a side of the collector layer opposite the first base layer or the second base layer.

5. The apparatus of claim 4, wherein the collector layer includes gallium arsenide, silicon, germanium, aluminum phosphide, aluminum arsenide, indium phosphide, or gallium nitride.

6. The apparatus of claim 1, wherein a first finger in the first plurality of parallel fingers has a first width, and a second finger in the second plurality of parallel fingers has a second width that is the same as the first width.

7. The apparatus of claim 1, wherein a first finger in the first plurality of parallel fingers has a first width, and a second finger in the second plurality of parallel fingers has a second width that is different than the second width.

8. A system comprising:
   a first varactor pair that includes a first base layer arranged in a first plurality of parallel fingers, a second base layer arranged in a second plurality of parallel fingers that are interspersed with the first plurality of parallel fingers, and a first collector layer coupled with the first base layer and the second base layer; and
   a second varactor pair that includes a third base layer arranged in a third plurality of parallel fingers, a fourth base layer arranged in a fourth plurality of parallel fingers interspersed with the third plurality of parallel fingers, and a second collector layer coupled with the third base layer and the fourth base layer, wherein the first base layer is electrically coupled with the third base layer, and the second base layer is electrically coupled with the fourth base layer.

9. The apparatus of claim 8, wherein the first plurality of parallel fingers and the third plurality of parallel fingers have a first orientation, and the second plurality of parallel fingers and the fourth plurality of parallel fingers have a second orientation that is opposite the first orientation; and
   wherein the first plurality of parallel fingers and the fourth plurality of parallel fingers are opposite one another, and the second plurality of parallel fingers and the third plurality of parallel fingers are opposite one another.

10. The apparatus of claim 8, further comprising a first metal layer directly coupled with the first base layer on a side of the first base layer opposite the first collector layer, and a second metal layer directly coupled with the first metal layer on a side of the first metal layer opposite the first base layer.

11. The apparatus of claim 10, wherein the first metal layer or the second metal layer includes titanium, platinum, gold, zinc, nickel, or beryllium.

12. The apparatus of claim 8, further comprising a sub-collector layer directly coupled with the collector layer on a side of the collector layer opposite the first base layer or the second base layer.

13. The apparatus of claim 12, wherein the collector layer includes gallium arsenide, silicon, germanium, aluminum phosphide, aluminum arsenide, indium phosphide, or gallium nitride.

14. The apparatus of claim 8, wherein a first finger in the first plurality of parallel fingers has a first width, and a second finger in the second plurality of parallel fingers has a second width that is the same as the first width.

15. The apparatus of claim 8, wherein a first finger in the first plurality of parallel fingers has a first width, and a second finger in the second plurality of parallel fingers has a second width that is different than the second width.

\* \* \* \* \*